(12) United States Patent
Maxwell et al.

(10) Patent No.: US 7,846,782 B2
(45) Date of Patent: Dec. 7, 2010

(54) DIODE ARRAY AND METHOD OF MAKING THEREOF

(75) Inventors: Steven Maxwell, Sunnyvale, CA (US);
Michael Konevecki, San Jose, CA (US);
Mark H. Clark, Santa Clara, CA (US);
Usha Raghuram, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 417 days.

(21) Appl. No.: 11/864,532

(22) Filed: Sep. 28, 2007

(65) Prior Publication Data

US 2009/0085153 A1  Apr. 2, 2009

(51) Int. Cl.
*H01L 21/82* (2006.01)

(52) U.S. Cl. .................... 438/131; 257/530; 257/50; 257/390; 257/209; 257/142

(58) Field of Classification Search .................. None
See application file for complete search history.

(56) References Cited

U.S. PATENT DOCUMENTS

| | | | |
|---|---|---|---|
| 4,646,266 A | 2/1987 | Ovshinsky et al. | |
| 4,665,428 A | 5/1987 | Hockley et al. | |
| 5,432,729 A | 7/1995 | Carson et al. | |
| 5,559,732 A | 9/1996 | Birge | |
| 5,693,556 A | 12/1997 | Cleeves | |
| 5,745,407 A | 4/1998 | Levy et al. | |
| 5,751,012 A | 5/1998 | Wolstenholme et al. | |
| 5,835,396 A | 11/1998 | Zhang | |
| 5,915,167 A | 6/1999 | Leedy | |
| 5,962,911 A | 10/1999 | Manley | |
| 5,991,193 A | 11/1999 | Gallagher et al. | |
| 6,034,882 A | 3/2000 | Johnson et al. | |
| 6,111,784 A | 8/2000 | Nishimura et al. | |
| 6,236,587 B1 | 5/2001 | Gudesen et al. | |
| 6,306,718 B1 | 10/2001 | Singh et al. | |
| 6,420,215 B1 | 7/2002 | Knall et al. | |
| 6,462,388 B1 * | 10/2002 | Perner ........................ 257/390 |
| 6,483,736 B2 | 11/2002 | Johnson et al. | |
| 6,486,065 B2 | 11/2002 | Vyvoda et al. | |
| 6,525,953 B1 | 2/2003 | Johnson | |

(Continued)

FOREIGN PATENT DOCUMENTS

EP    1 450 373    8/2004

(Continued)

OTHER PUBLICATIONS

U.S. Appl. No. 10/095,962, filed Mar. 13, 2002, Herner et al.

(Continued)

*Primary Examiner*—Ha Tran T Nguyen
*Assistant Examiner*—Shantanu C Pathak
(74) *Attorney, Agent, or Firm*—The Marbury Law Group PLLC

(57) ABSTRACT

A method of making a non-volatile memory device includes providing a substrate having a substrate surface, and forming a non-volatile memory array over the substrate surface. The non-volatile memory array includes an array of semiconductor diodes, and each semiconductor diode of the array of semiconductor diodes is disposed substantially parallel to the substrate surface.

12 Claims, 21 Drawing Sheets

U.S. PATENT DOCUMENTS

| | | | |
|---|---|---|---|
| 6,541,312 | B2 | 4/2003 | Vyvoda et al. |
| 6,567,301 | B2 | 5/2003 | Anthony et al. |
| 6,584,029 | B2 | 6/2003 | Tran et al. |
| 6,677,220 | B2 | 1/2004 | Van Brocklin et al. |
| 6,693,823 | B2 | 2/2004 | Brown |
| 6,777,773 | B2 | 8/2004 | Knall |
| 6,881,994 | B2 | 4/2005 | Lee et al. |
| 6,946,719 | B2 | 9/2005 | Petti et al. |
| 6,951,780 | B1 | 10/2005 | Herner |
| 6,952,030 | B2 | 10/2005 | Herner et al. |
| 6,952,043 | B2 | 10/2005 | Vyvoda et al. |
| 7,038,248 | B2 | 5/2006 | Lee |
| 7,176,064 | B2 | 2/2007 | Herner |
| 2003/0001230 | A1 | 1/2003 | Lowrey |
| 2003/0173643 | A1* | 9/2003 | Herner ..................... 257/530 |
| 2004/0016991 | A1 | 1/2004 | Herner et al. |
| 2004/0228159 | A1 | 11/2004 | Kostylev et al. |
| 2004/0232509 | A1 | 11/2004 | Vyvoda et al. |
| 2005/0052915 | A1 | 3/2005 | Herner et al. |
| 2005/0098800 | A1 | 5/2005 | Herner et al. |
| 2005/0121742 | A1 | 6/2005 | Petti et al. |
| 2005/0158950 | A1 | 7/2005 | Scheuerlein et al. |
| 2006/0250836 | A1 | 11/2006 | Herner et al. |
| 2006/0250837 | A1 | 11/2006 | Herner et al. |
| 2007/0072360 | A1 | 3/2007 | Kumar et al. |
| 2007/0114509 | A1 | 5/2007 | Herner |
| 2007/0164309 | A1* | 7/2007 | Kumar et al. ............... 257/142 |

FOREIGN PATENT DOCUMENTS

| WO | WO 2004/055827 | 7/2004 |
|---|---|---|

OTHER PUBLICATIONS

U.S. Appl. No. 10/185,507, filed Jun. 27, 2002, Vyvoda et al.
U.S. Appl. No. 10/440,882, filed May 19, 2003, Vyvoda et al.
U.S. Appl. No. 10/728,436, filed Dec. 5, 2003, Chen.
U.S. Appl. No. 10/728,451, filed Dec. 5, 2003, Cleeves et al.
U.S. Appl. No. 10/815,312, filed Apr. 1, 2004, Chen.
U.S. Appl. No. 10/883,417, filed Jun. 30, 2004, Raghuram et al.
U.S. Appl. No. 10/954,510, filed Sep. 29, 2004, Herner.
U.S. Appl. No. 11/148,530, filed Jun. 8, 2006, Herner et al.
U.S. Appl. No. 11/395,995, filed Mar. 31, 2006, Herner et al.
U.S. Appl. No. 11/444,936, May 31, 2006, filed May 31, 2006, Radigan et al.
U.S. Appl. No. 11/693,858, Mar. 30, 2007, Kumar et al.
Alavi et al, "A PROM Element Based on Salicide Agglomeration of Poly Fuses in a CMOS Logic Process", IEDM 1997.
Amemiya et al., "Electrical Trimming of Heavily Doped Polycrystalline Silicon Resistors", IEEE Transactions Electron Devices, vol. ED-26, No. 11, Nov. 1979.
Babcock, J. A. et al., "Polysilicon Resistor Trimming for Packaged Integrated Circuits", IEDM 93, 1993, pp. 247-250.
Babcock, J. A. et al., "Precision Electrical Trimming of Very Low TCR Poly-Sige Resistors," IEEE Service Center, vol. 21, No. 6, Jun. 2000, pp. 283-285, abstract Figs. 2, 4.
Das, Soumen et al., "Electrical Trimming of Ion-Beam-Sputtered Polysilicon Resistors by High Current Pulses", IEEE Transaction of Electron Devices, vol. 41, No. 8, pp. 1429-1434, Aug. 1994.
Feldbaumer, D. W. et al., "Theory and Application of Polysilicon Resistor Trimming", Solid-State Electronics, vol. 38, No. 11, 1995, pp. 1861-1869.
Feldbaumer, D.W., "Pulse Current Trimming of Polysilicon Resistors", IEEE Transactions on Electron Devices, vol. 42, No. 4, pp. 689-696, Apr. 1995.
Kato, Kotaro el al., "A Monolithic 14 Bit D/A Converter Fabricated with a New Trimming Technique (DOT)", IEEE Journal of Solid-State Circuits, vol. SC-19, No. 5, pp. 802-804-806, Oct. 1984.
Kato, Kotaro el al., "A Physical Mechanism of Current-Induced Resistance Decrease in Heavily Doped Polysilicon Resistors", IEEE Transaction on Electron Devices, vol. ED-29, No. 8, pp. 1156-1160, Aug. 1982.
Kato, Kotaro et al., "Change in Temperature Coefficient of Resistance of Heavily Doped Polysilicon Resistors Caused by Electrical Trimming", Jpn. J. Appl. Phys., vol. 35, Part 1, No. 8, pp. 14209-4215, Aug. 1996.
Lane, William A., "The Design of Thin-Film Polysilicon Resistors for Analog IC Applications", IEEE Transactions on Electron Devices, vol. 36, No. 4, pp. 738-744, Apr. 1989.
Tobita, Toshio, "New Trimming Technology of a Thick Film Resistor by the Pulse Voltage Method", IEEE Transactions on Components, Hybrids and Manufacturing Technology, vol. 14, No. 3, pp. 613-617, Sep. 1991.

* cited by examiner

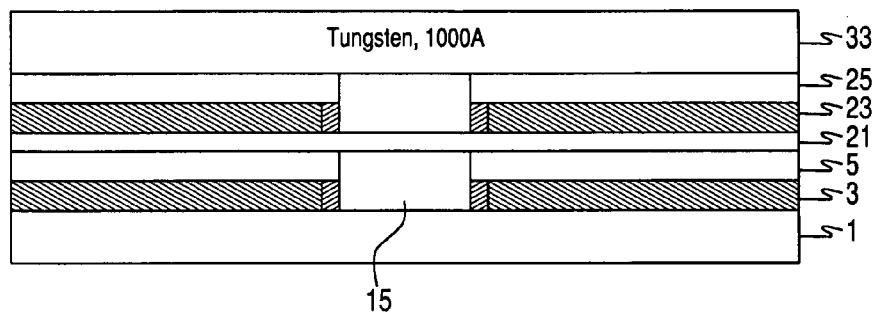
Fig. 2C
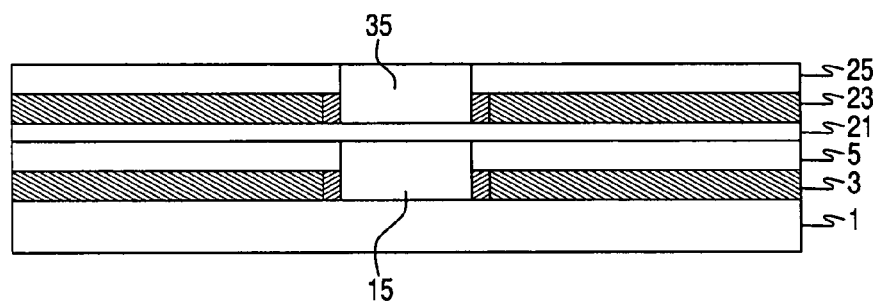
Fig. 2D
Fig. 3A
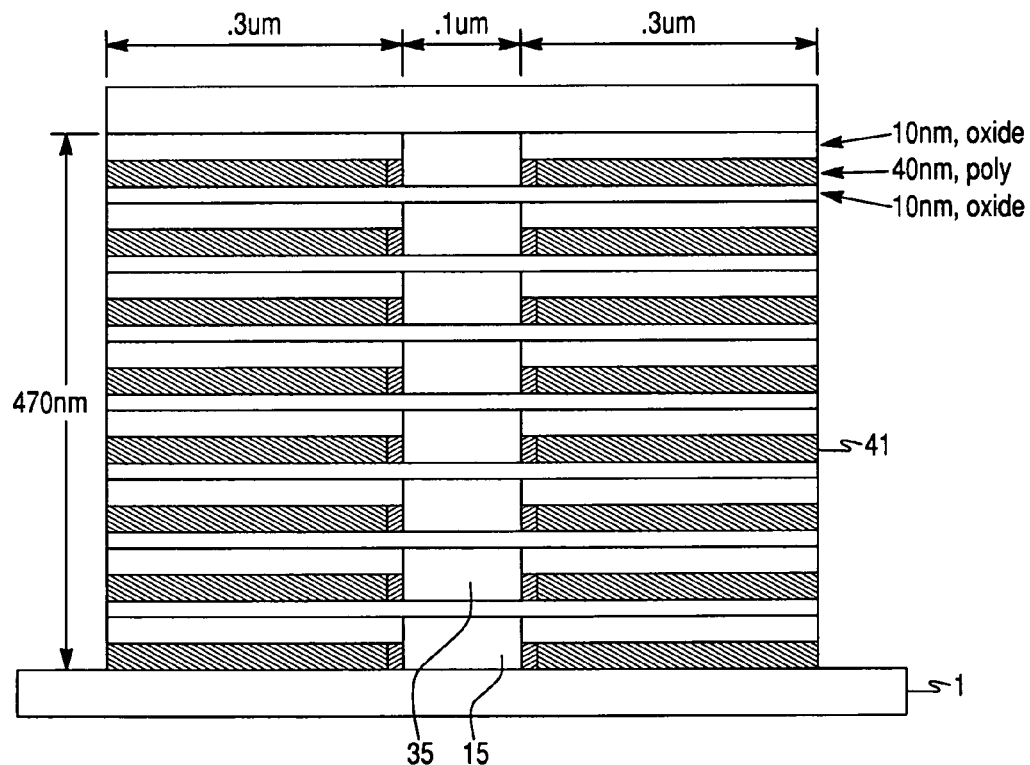

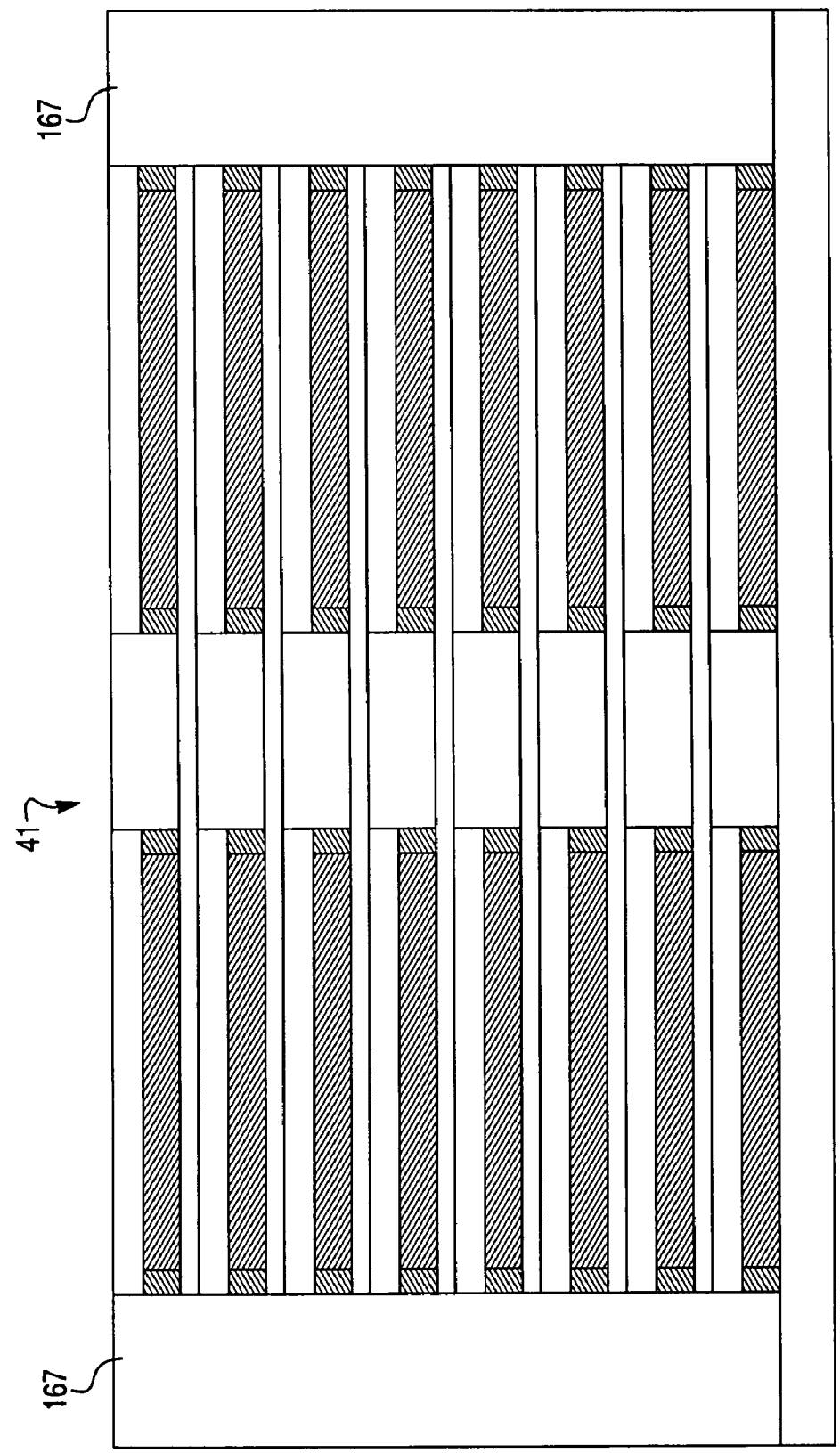

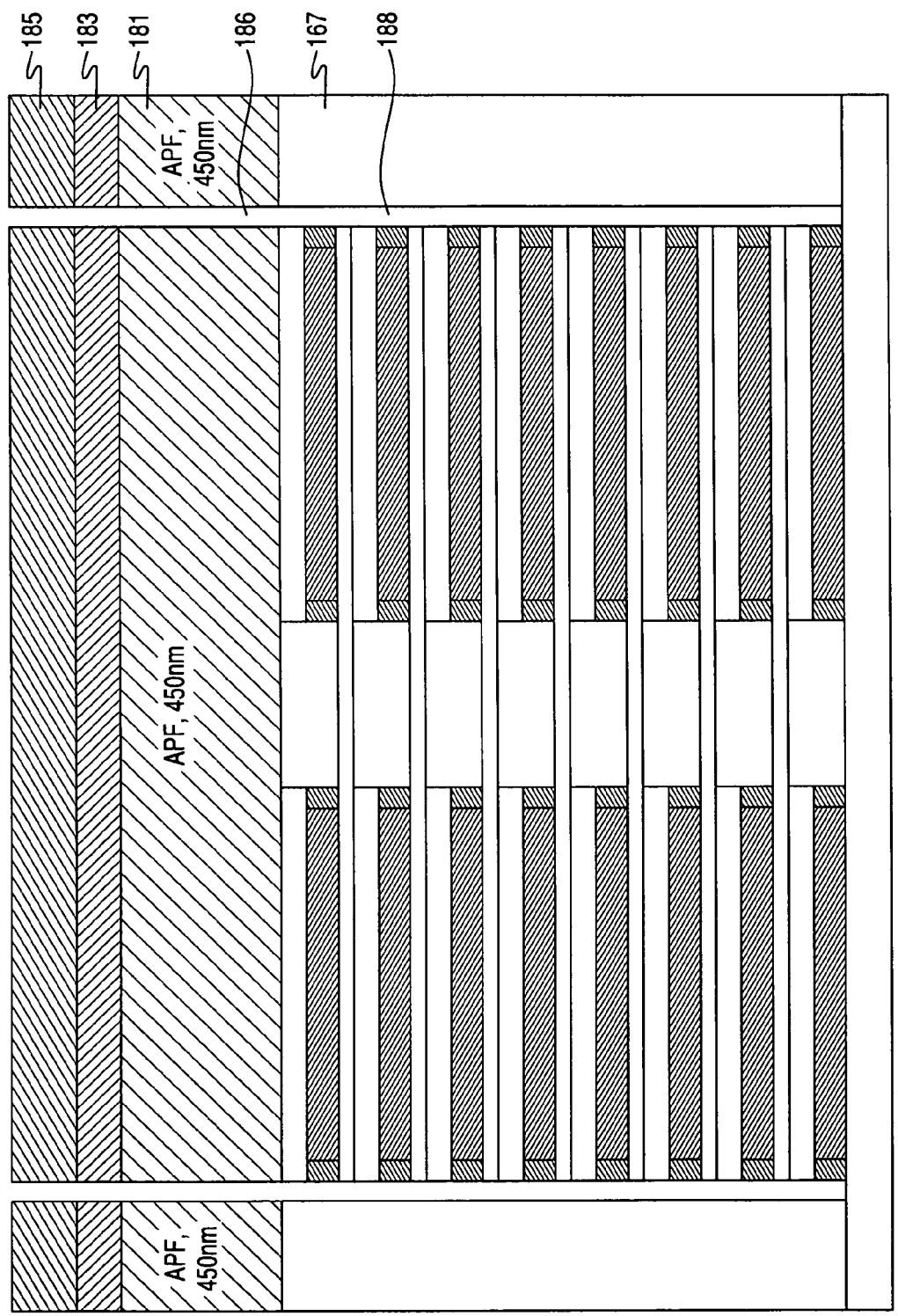

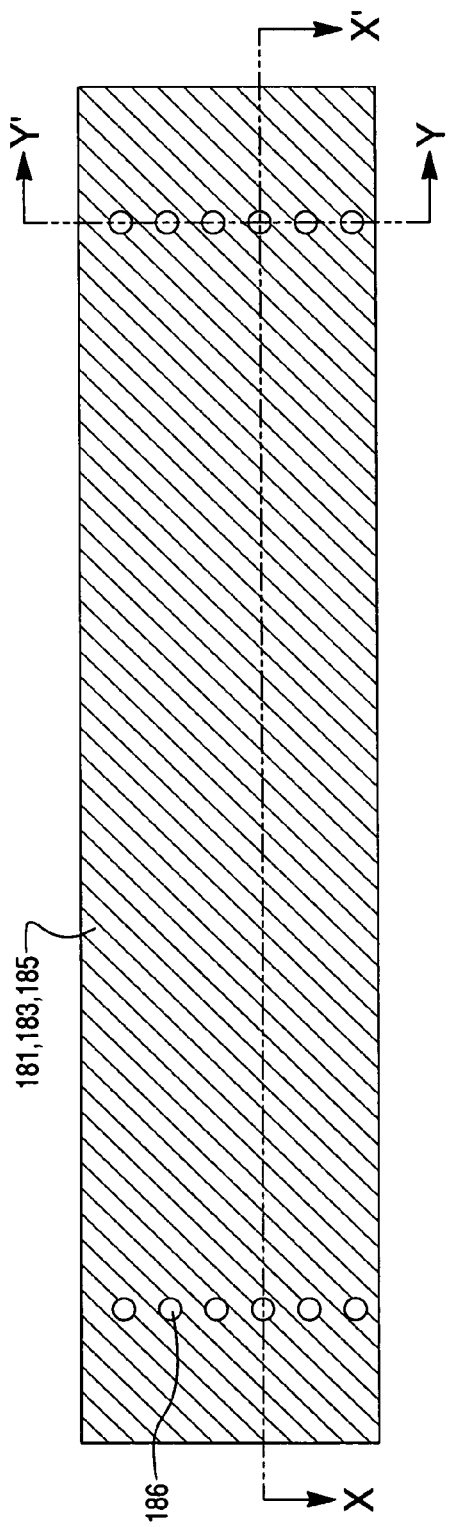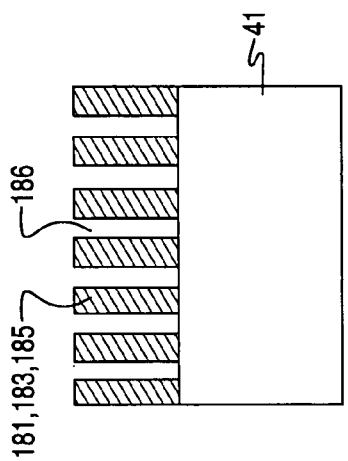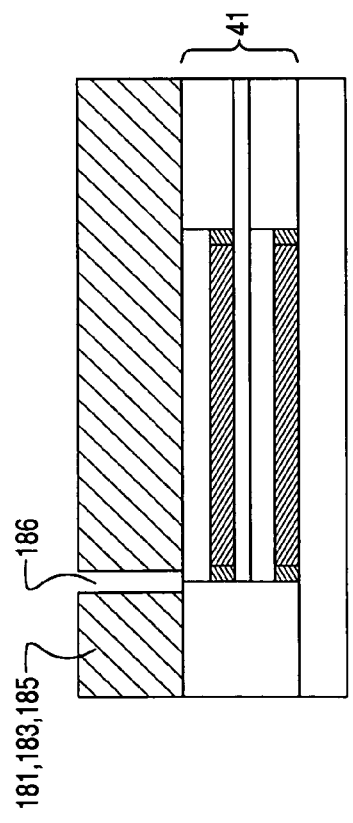

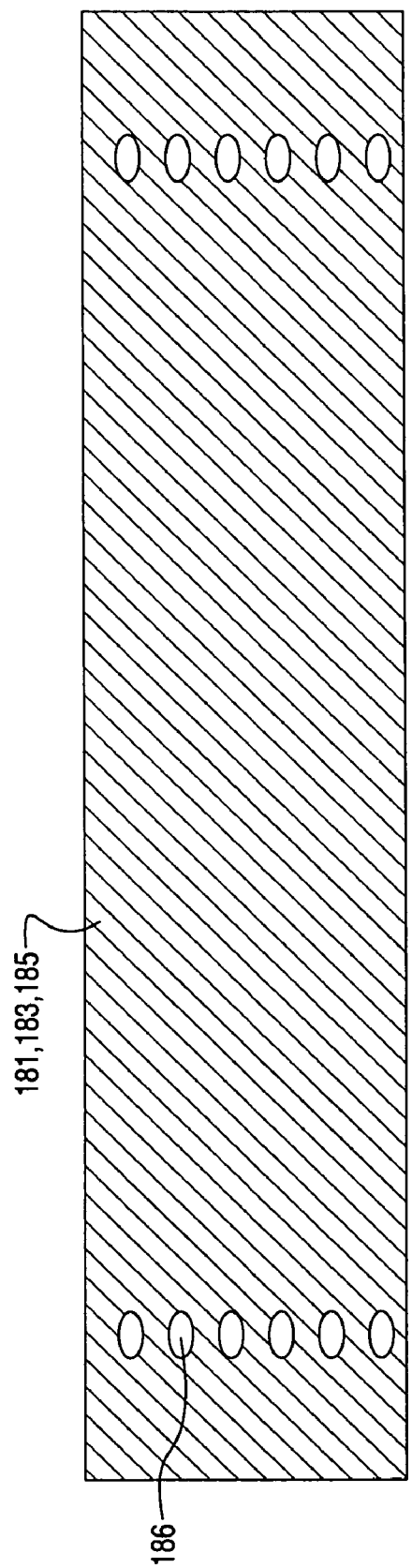

DIODE ARRAY AND METHOD OF MAKING THEREOF

BACKGROUND OF THE INVENTION

The invention relates generally to a semiconductor device and method of making thereof and more specifically to a diode nonvolatile memory array and method of making thereof.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

SUMMARY

One embodiment of the invention provides a non-volatile memory device, comprising a substrate having a substrate surface, and a non-volatile memory array located over the substrate surface. The non-volatile memory array comprises an array of semiconductor diodes, and each semiconductor diode of the array of semiconductor diodes is disposed substantially parallel to the substrate surface.

Another embodiment of the invention provides a method of making a non-volatile memory device, comprising providing a substrate having a substrate surface, and forming a non-volatile memory array over the substrate surface. The non-volatile memory array comprises an array of semiconductor diodes, and each semiconductor diode of the array of semiconductor diodes is disposed substantially parallel to the substrate surface.

BRIEF DESCRIPTION OF THE DRAWINGS

FIGS. 1A, 1B, 1C, 1D, 2A, 2B, 2C, 2D, 3A, 3B, 4, 5A, 5B, 5C, 5D, 6A, 6C, 6D, 7A, 7B, 8A, 8C, 8D, 9A, 9B and 9C are side cross sectional views of an in-process device during the processing steps of a method according to one embodiment of the invention.

FIGS. 10A, 10B, 10C, 10E, 10F, 10H, 10I and 10J are side cross sectional views of an in-process device during the processing steps of a method according to another embodiment of the invention. FIGS. 10D and 10G are top views of an in-process device during the processing steps of this method.

DETAILED DESCRIPTION OF THE EMBODIMENTS

A method of making a semiconductor device according to one embodiment of the invention is illustrated in FIGS. 1 to 9. While diodes are fabricated by this exemplary method, it should be understood that other suitable devices, such as transistors, resistors or capacitors may be formed in addition to or instead of the diodes. Furthermore, while non-volatile memory devices are described, the diode array may also be used in a volatile memory device or in a logic device. All dimension ranges provided below are exemplary and other suitable dimensions may also be used.

Figure 1A:
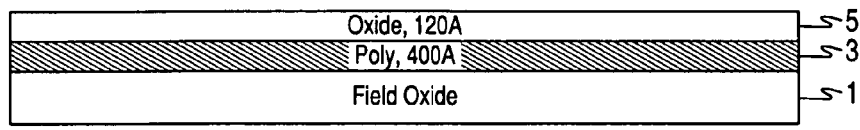

As shown in FIG. 1A, a first semiconductor layer 3 is formed over a substrate surface 1. The substrate may comprise a semiconductor substrate, such as a silicon or a compound semiconductor wafer. Alternatively, other substrate materials, such as glass, metal, plastic, ceramic, quartz, etc. may also be used. The surface of the substrate may comprise an insulating surface, such as a field oxide or an insulating layer. Alternatively, the surface of the substrate may be a metal or semiconductor surface. Additional devices, such as driver or control circuits may be formed in or on the substrate below the first semiconductor layer. The first semiconductor layer may comprise a silicon, germanium or a compound semiconductor layer, such as SiGe, GaAs or GaN for example. The first semiconductor layer may be a single crystal, polycrystalline or amorphous layer. For example, in the embodiment illustrated in FIG. 1A, the semiconductor layer is polysilicon. The first semiconductor layer may be about 200 to about 600 Angstroms, such as about 400 Angstroms thick. This layer may be formed by any suitable method, such as sputtering, CVD, etc.

A first insulating layer 5 is then formed over the first semiconductor layer. The insulating layer may be a silicon oxide, silicon nitride or silicon oxynitride layer or a high dielectric constant insulating layer, such as a tantalum pentoxide or aluminum oxide layer. Alternatively, the first insulating layer may be an organic insulating layer. For example, the first insulating layer may be an about 80 to about 400 Angstrom thick silicon oxide layer, such as for example a 120 Angstrom thick silicon oxide layer. This layer may be formed by any suitable method, such as sputtering, CVD, etc.

Figure 1B:
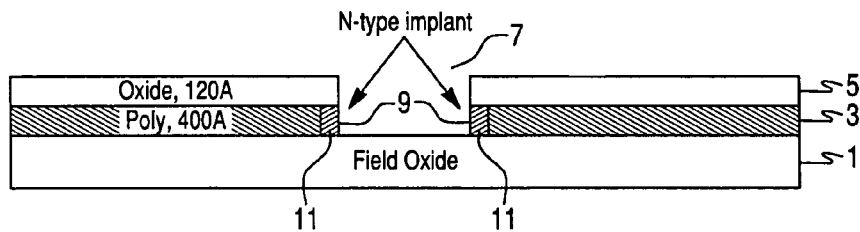

As shown in FIG. 1B, a first trench 7 is formed extending through the first semiconductor layer and the first insulating layer to the substrate surface. The first trench may be formed by photolithography and etching. Other methods may also be used. The trench may be a line shaped trench with a width of about 1000 to about 2000 Angstroms, such as about 1500 Angstroms.

Then, the first sidewalls 9 of the first semiconductor layer which are exposed in the first trench 7 are doped with dopants of a first conductivity type to form first conductivity type regions 11. For example, the first conductivity type dopants may comprise n-type dopants, such as phosphorus and/or arsenic. Alternatively the first conductivity type may comprise p-type. The n-type dopants may be introduced into the first semiconductor layer by an angled halo implant or by a phosphene soak.

If desired, an optional antifuse dielectric layer is formed on the doped sidewalls in the trench. The antifuse dielectric layer may be formed by selectively oxidizing the exposed semiconductor layer sidewalls in the trench in any suitable oxidizing ambient, such as dry or wet oxidizing ambient. Alternatively, the antifuse dielectric layer may be deposited over the first insulating layer and in contact with the exposed sidewalls of the first semiconductor layer. The antifuse dielectric layer may comprise silicon oxide, silicon nitride or a high dielectric constant material, such as tantalum pentoxide or aluminum oxide. If desired, the antifuse dielectric layer may be omitted entirely.

Figure 1C:
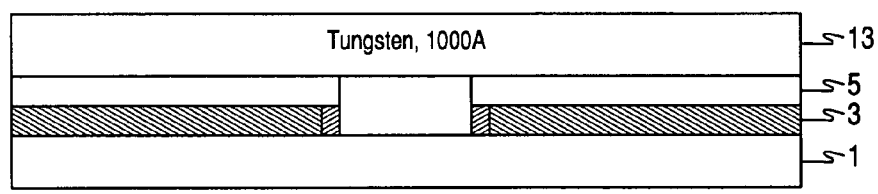

Then, as shown in FIG. 1C, a first conductive layer 13 is formed in the first trench and over the first insulating layer. The conductive layer may comprise any suitable conductive material, such as metal(s), polysilicon, titanium nitride, etc.

The conductive layer may comprise one or more sublayers. For example, the conductive layer may comprise a thin bottom Ti sublayer (for subsequent silicide formation), a thin middle TiN layer and an upper W plug/fill sublayer. The W plug may be between about 500 and about 1500 Angstroms thick, such as about 1000 Angstroms thick. These sublayers may be deposited by any suitable methods, such as sputtering, CVD, etc.

Figure 1D:
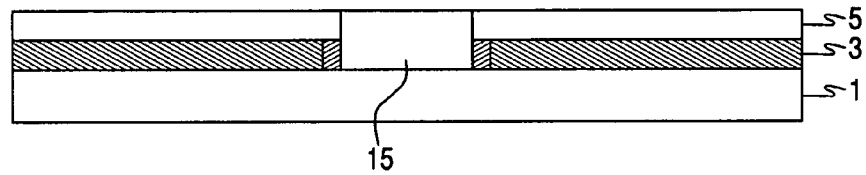

Then, as shown in FIG. 1D, the first conductive layer 13 is planarized. The planarization may be conducted by etchback or chemical mechanical polishing which stops on the first insulating layer 5 which acts as an etch stop. Thus, the first conductive layer forms a first horizontal conductor 15 in the first trench. The first horizontal conductor electrically contacts first conductivity type regions 11 in the first semiconductor layer 3. In the view shown in FIG. 1D, the first horizontal conductor extends in and out of the page. This completes the first device layer.

Figure 2A:
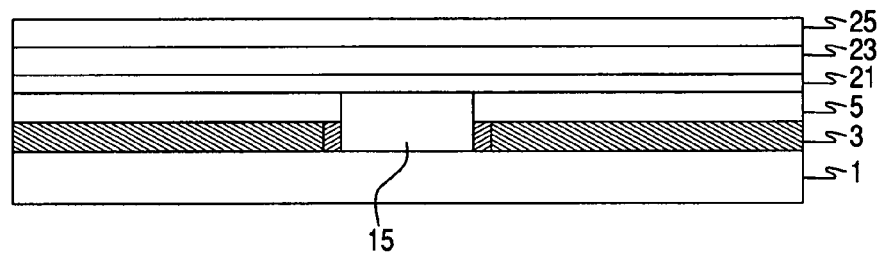

The steps shown in FIGS. 1A to 1D are then optionally repeated to monolithically form a second device level over the first device level. As shown in FIG. 2A, an interlevel insulating layer 21 is formed over the first horizontal conductor 15. This interlevel insulating layer may comprise silicon oxide, silicon nitride, high dielectric constant insulating material or an organic insulating material. It may be between about 50 and about 150 Angstroms, such as about 100 Angstroms thick. A second semiconductor layer 23 is then formed over the interlevel insulating layer 21. A second insulating layer 25 is formed over the second semiconductor layer.

Figure 2B:
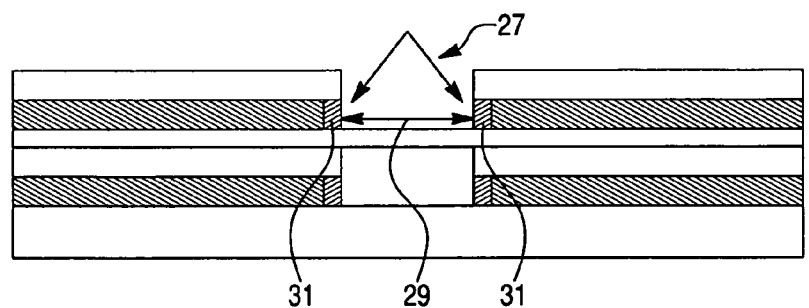

As shown in FIG. 2B, a second trench 27 is formed extending through the second semiconductor layer 23 and the second insulating layer 25 up to the interlayer insulating layer 21. The first sidewalls 29 of the second semiconductor layer exposed in the second trench are then doped with dopants of the first conductivity type, such as the n-type dopants to form first conductivity type regions 31. An optional second antifuse dielectric layer may be formed at this time.

As shown in FIG. 2C, a second conductive layer 33 is formed in the second trench and over the second insulating layer.

As shown in FIG. 2D, the second conductive layer 33 is planarized such that the second conductive layer forms a second horizontal conductor 35 in the second trench and the second horizontal conductor electrically contacts first conductivity type regions in the second semiconductor layer. This completes the second device level.

These steps may be repeated as many times as needed to form any suitable number of device levels. For example, two to eight device levels, such as four to six levels may be formed. FIG. 3A shows eight device levels.

Then, as shown in FIG. 3A, an isolation patterning step is performed. This step may comprise a photolithography and etching step, such as a 248 nm or an I-line patterning lithography process. As shown in FIG. 3A, each diode may be between about 0.1 and about 0.5 microns wide, such as about 0.3 microns wide, while the horizontal conductor may be between about 0.05 and about 0.2 microns wide, such as about 0.1 to about 0.15 microns wide. During the isolation patterning step, the first semiconductor layer, the first insulating layer, the second semiconductor layer and the second insulating layer are patterned into a stack 41 to expose sidewalls of the first and the second semiconductor layers (as well as sidewalls of additional semiconductor layers in additional device layers). The height of the stack may be about 300 nm to about 800 nm, such as about 470 nm for example.

Figure 3B:
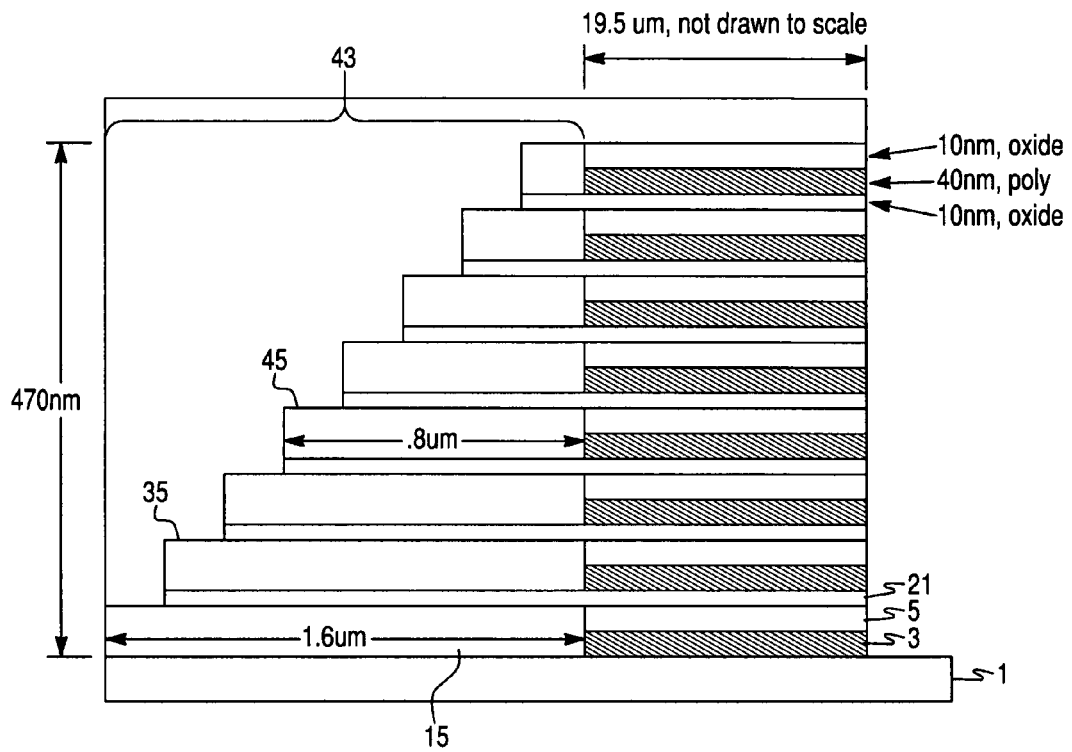

FIG. 3B shows the side cross sectional view of the device rotated 90 degrees with respect to FIG. 3A (i.e., a cross sectional view in and out of the page through FIG. 3A). As shown in FIG. 3B, each horizontal conductor 15, 35, etc. is patterned such that a portion of each underlying horizontal conductor is exposed below the adjacent overlying horizontal conductor in a stepped configuration. For example, for an about 400 to about 550 nm, such as about 470 nm high device stack, the horizontal conductors may be between about 10 and about 30 microns long, such as about 19.5 to about 20 nm long with an about 0.5 to about 2 microns back contact area 43. As shown in FIG. 3B, the lower most horizontal conductor 15 may have an about 1.6 micron contact area, while a middle horizontal conductor 45 may have an about 0.8 microns contact area. This provides an about 0.2 to about 0.4 micron exposed step between adjacent horizontal conductors. Separate electrical connectors or contacts are formed in contact with the exposed portion of each horizontal conductor. Each horizontal conductor may serve as a bit line of the nonvolatile memory device. Alternatively, the horizontal conductors may be used as word lines of the memory device.

Figure 4:
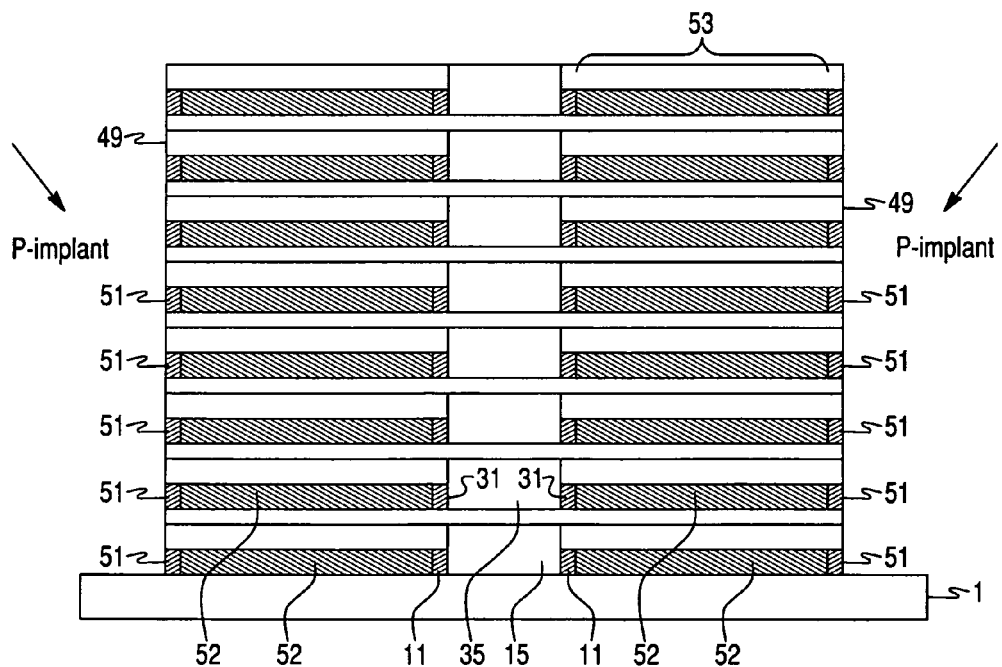

Then, at least one exposed second sidewall of each of the first and the second semiconductor layers is doped with dopants of a second conductivity type to form second conductivity type regions 51. For example, as shown in FIG. 4, the left sidewalls 49 of the semiconductor layers on the left of the horizontal conductors and the right sidewalls of the semiconductor layers on the right of the horizontal conductors are doped by angled (halo) ion implantation. Alternatively, a $BCl_3$ soak may be used instead. If the first conductivity type is n-type, then the second conductivity type is p-type. Preferably, but not necessarily, an intrinsic region 52 remains between the p-type regions 51 and n-type regions 11, 31 to form horizontal p-i-n type diodes 53. However, the intrinsic region may be omitted to form p-n junction diodes instead. Thus, as shown in FIG. 4, two vertical columns of diodes are formed on either side of the horizontal conductors 15, 35, etc. However, one or more than two columns of horizontal diodes may be formed instead.

Figure 5A:
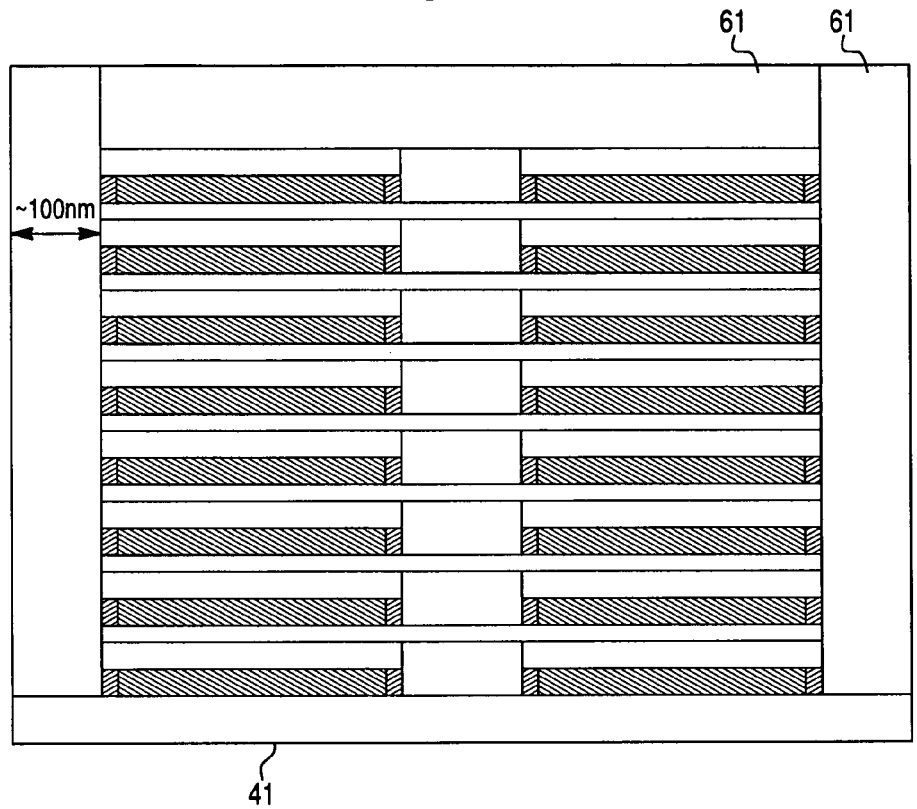
Figure 5B:
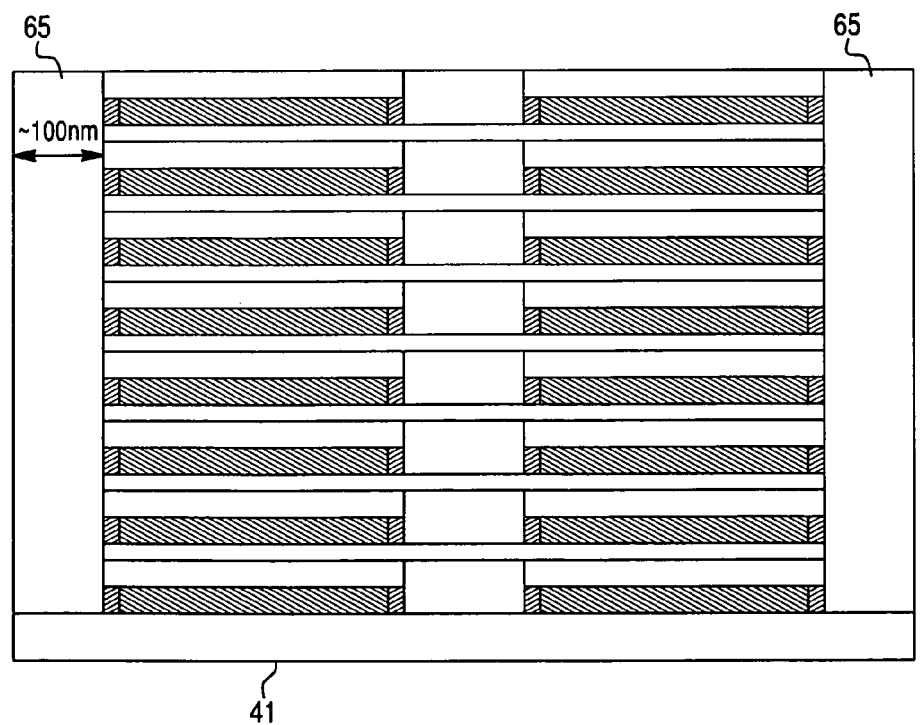

As shown in FIGS. 5A and 5B, at least one vertical pillar conductor which electrically contacts the second conductivity type regions 51 in the first and the second semiconductor layers is formed. For example, at least two vertical pillar conductors may be formed such that a first vertical pillar conductor is separated from the horizontal conductors and from the second vertical pillar conductor by the horizontal diodes along the left to right direction, as shown in FIG. 5A. The vertical pillar conductors may be formed by depositing TiN and W layers 61 over and adjacent to the device stack 41. If desired, a Ti layer may also be added under the TiN layer to subsequently form a silicide region between the pillar conductors and the semiconductor layers, as will be described in more detail below. As shown in FIG. 5B, a sidewall spacer type selective metal etch can then be used to form sidewall spacer shaped vertical pillar conductors 65. Alternatively, the vertical pillar conductors may be formed by planarizing the TiN and W layers using CMP or etchback to remove the TiN and W layers from the top of the stack 41 followed by lithographic patterning and etching of these layers to leave the vertical pillars adjacent to the sides of the device stack. In this case, the top of the device stack acts as a polish stop. Conductive materials other than TiN and/or W may also be used instead of or in addition to TiN and/or W. The vertical pillar conductors may be about 50 to about 200 nm wide, such as about 100 nm wide. If these pillar conductors are sidewall spacer shaped, then they are narrower at the top than at the bottom.

Figure 5C:
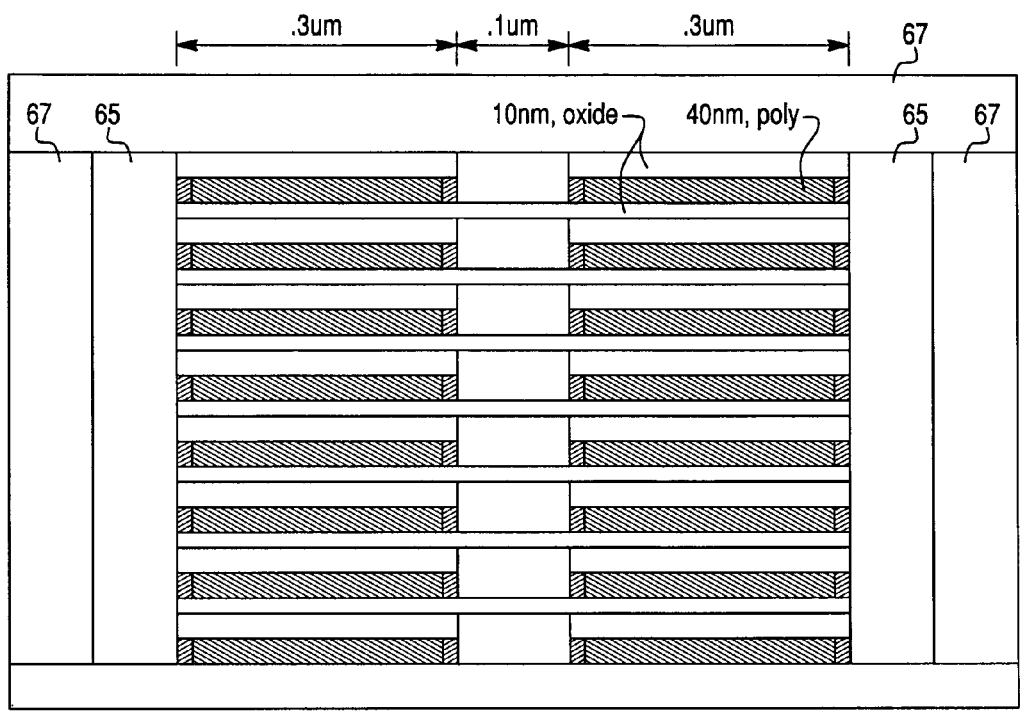
Figure 5D:
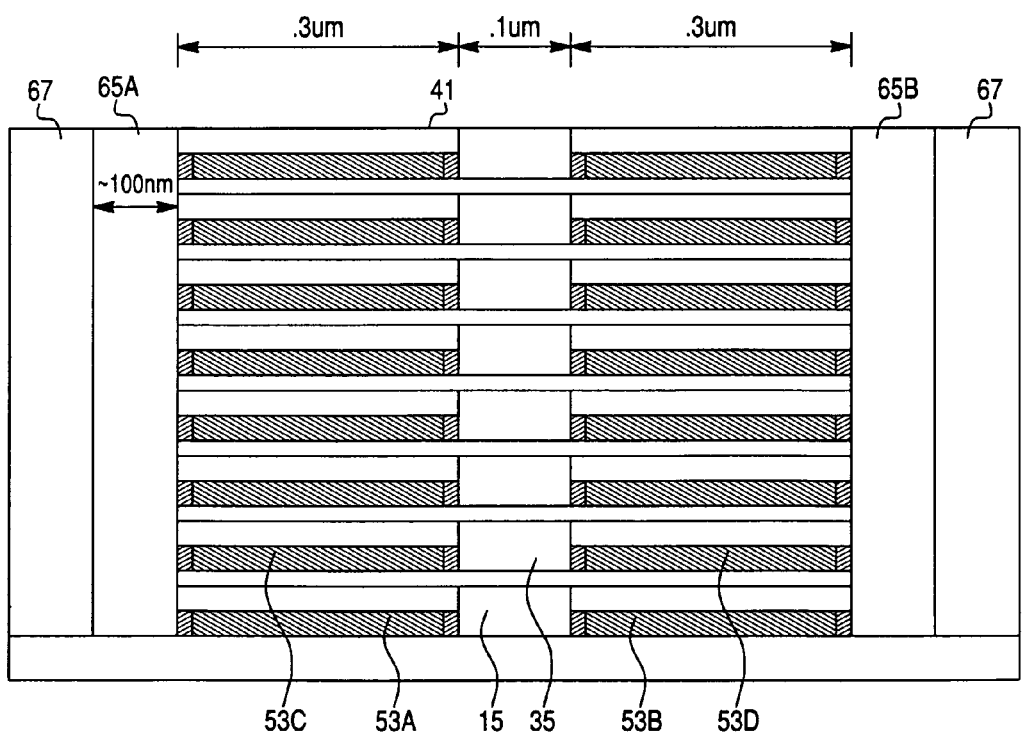

As shown in FIG. 5C, a gap fill insulating layer 67, such as silicon oxide or other insulating materials(s) described above, is formed over the device stack and adjacent to the sides of the vertical pillar conductors 65. As shown in FIG. 5D, this gap fill insulating layer is planarized, such as by CMP, to be removed from the top of the device stack 41.

As shown in FIG. 5D, a first semiconductor diode 53A is located in a first device level between the first vertical pillar conductor 65A and the first horizontal conductor 15, a second semiconductor diode 53B is located in the first device level between the second vertical pillar conductor 65B and the first horizontal conductor 15, a third semiconductor diode 53C is located in a second device level between the first vertical pillar conductor 65A and the second horizontal conductor 35, and a fourth semiconductor diode 35D is located in the second device level between the second vertical pillar conductor 65B and the second horizontal conductor 35.

Figure 6A:
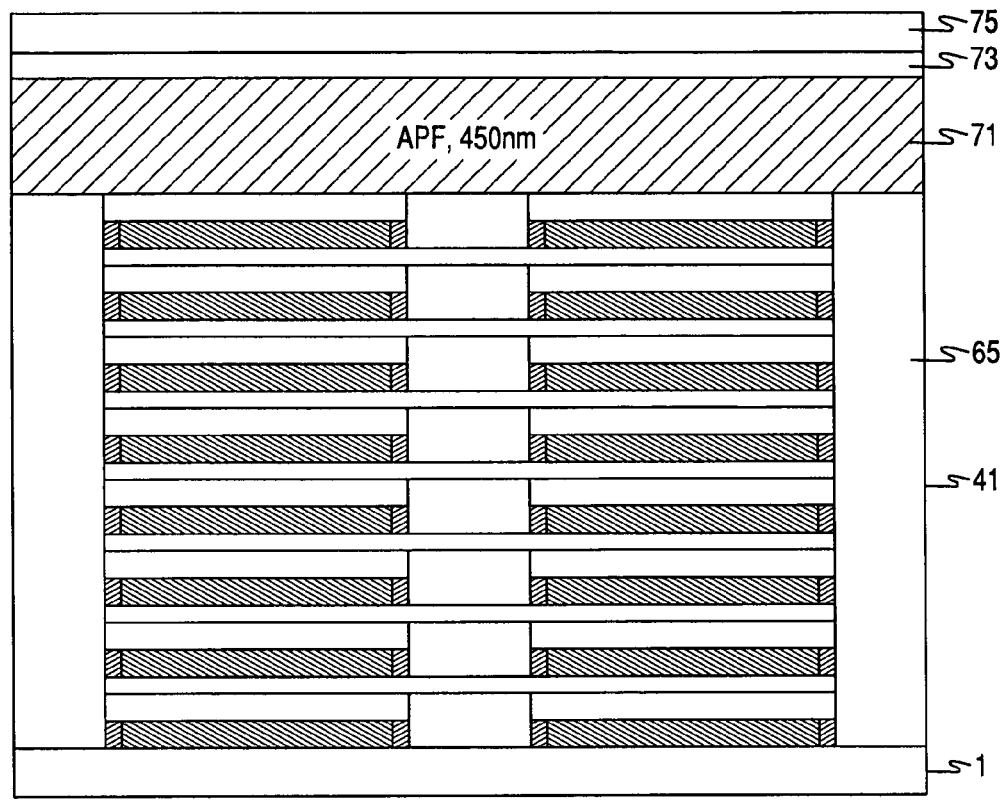

FIGS. 6A-6D illustrate the separation of the diodes in the "Y" direction (i.e., in the direction in and out of the page in FIG. 6A). One or more photosensitive layers are formed over the device stack. For example, photosensitive layers used in 45 nm type lithography may be formed, such as an advanced patterning film (APF, such as an amorphous carbon photomask film) 71 having a thickness of about 400 to about 500 nm, such as for example 450 nm, an antireflective coating, such as a dielectric antireflective coating (DARC) 73, having a thickness of about 10 to about 30 nm, for example about 20 nm, and a layer of 193 nm radiation sensitive photoresist 75, in that order. Other photosensitive layer or layers may also be used.

Figure 6B:
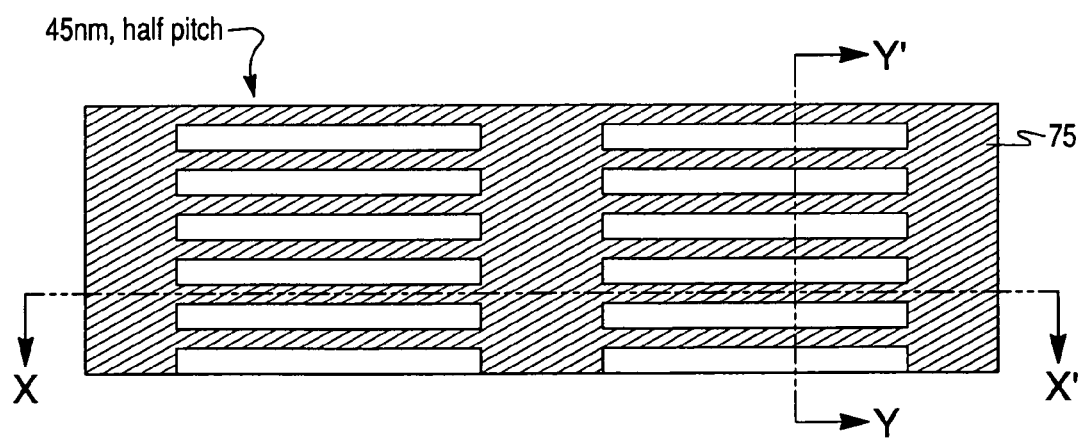
FIGS. 6B and 8B are top views of an in-process device during the processing steps of this method.
Figure 6C:
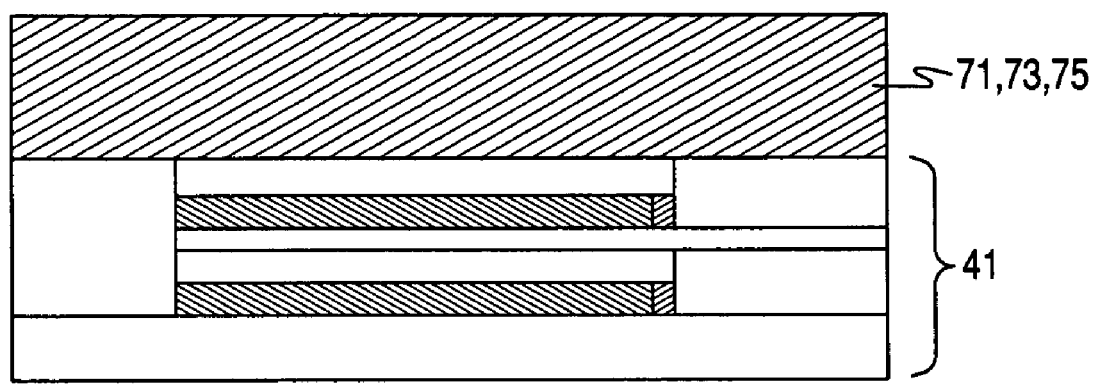
Figure 6D:
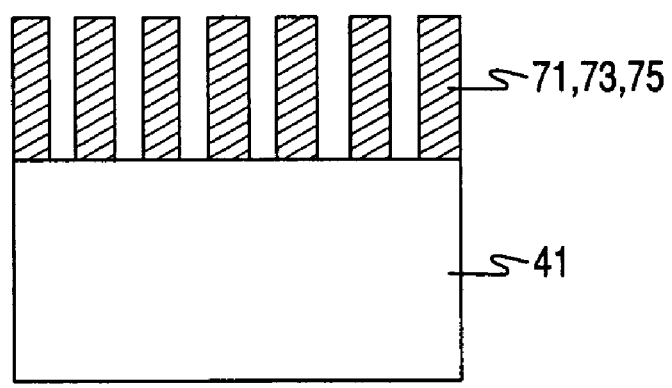

Then, the photoresist is exposed and patterned as shown in FIGS. 6B-6D. For example, immersion lithography (i.e., a lithography which utilizes a liquid at the interface) may be used to expose the photoresist. Other methods may also be used. FIG. 6B shows the top view of the patterned photoresist 75 with the underlying semiconductor and insulating layers exposed. The vertical pillar conductors 65 are masked by the resist patterns. FIG. 6C is the side cross sectional view of the device stack 41 along the X direction (line X-X' in FIG. 6B), while FIG. 6D is the side cross sectional view of the device stack 41 along the Y direction (line Y-Y' in FIG. 6B). The spacing between the photoresist patterns may be about 45 nm, half pitch. The semiconductor and insulating layers in the device stack are then etched to form isolation trenches in the Y direction extending through the device stack. Thus, the diodes are separated from each other in the Y direction (i.e., in and out of the page in FIG. 6A) perpendicular to the X direction. Any suitable etching gas or liquid may be used, such as a $SF_6$ and oxygen plasma. The resulting aspect ratio of the patterned layers may be about 9:1. While six photoresist patterns and diode areas are shown in FIG. 6B, it should be noted that more than or less than six such patterns may be formed, such as 10 to 1000 patterns. After the etching step, the photoresist, antireflective and APF layers are removed.

Figure 7A:
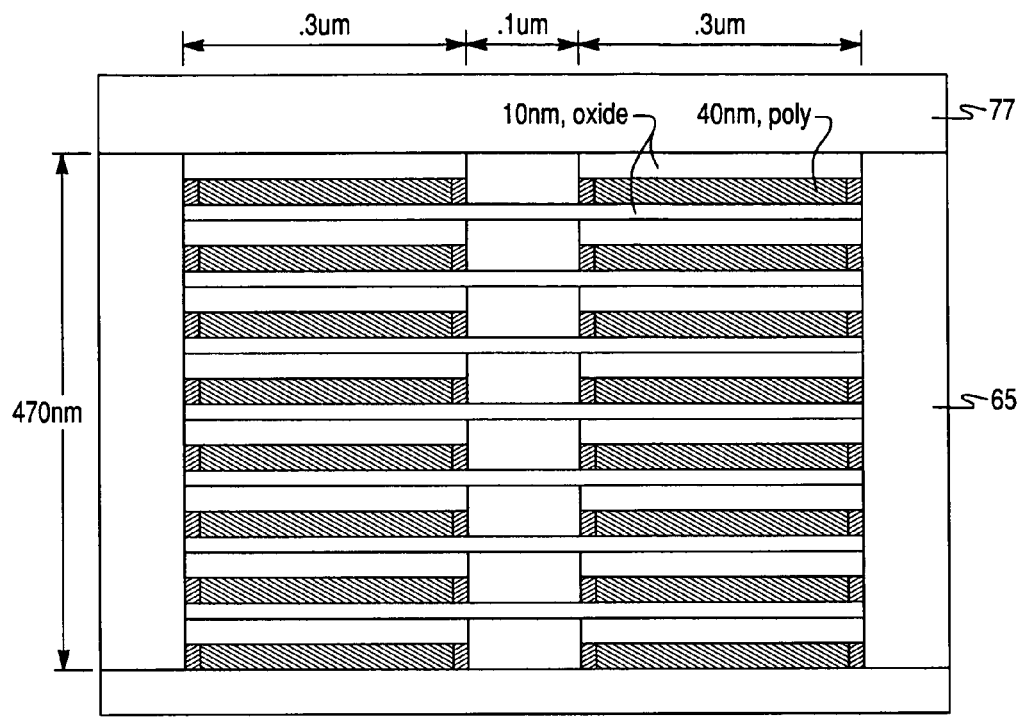
Figure 7B:
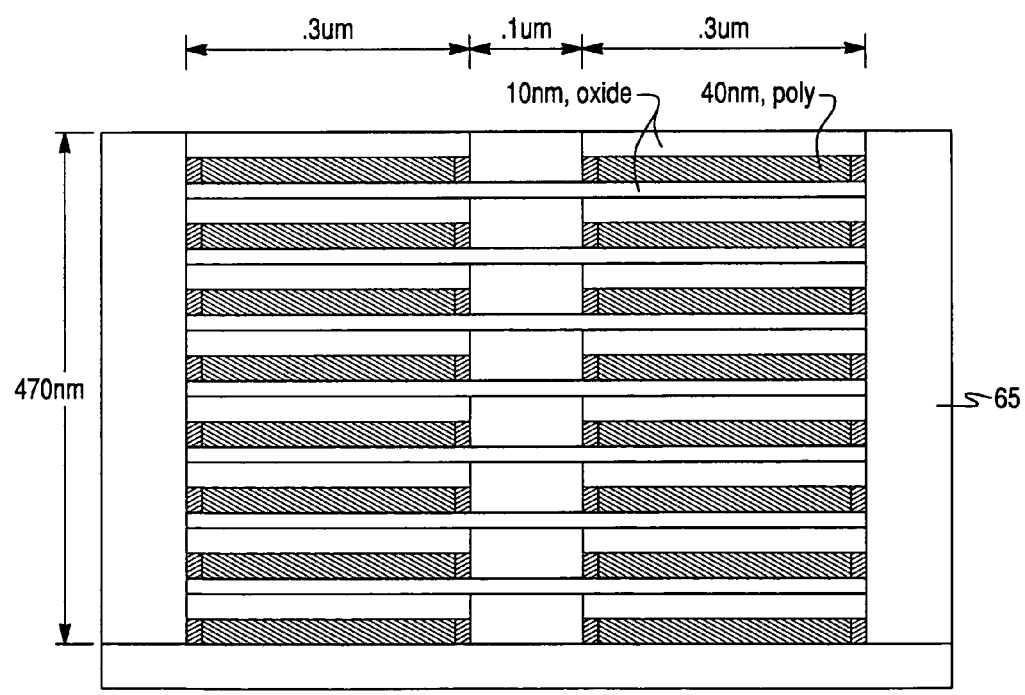

After the isolation trenches are formed, another gap fill insulating layer 77, such as silicon oxide or other materials listed above, is formed in the trenches and over the device stack, as shown in FIG. 7A. The gap fill layer is then planarized by CMP or other suitable methods with the top surface of the device stack, where the tungsten of the top most horizontal conductor acts as a polish stop, as shown in FIG. 7B. The gap fill insulating layer 77 remains in the isolation trenches between the diodes.

Figure 8A:
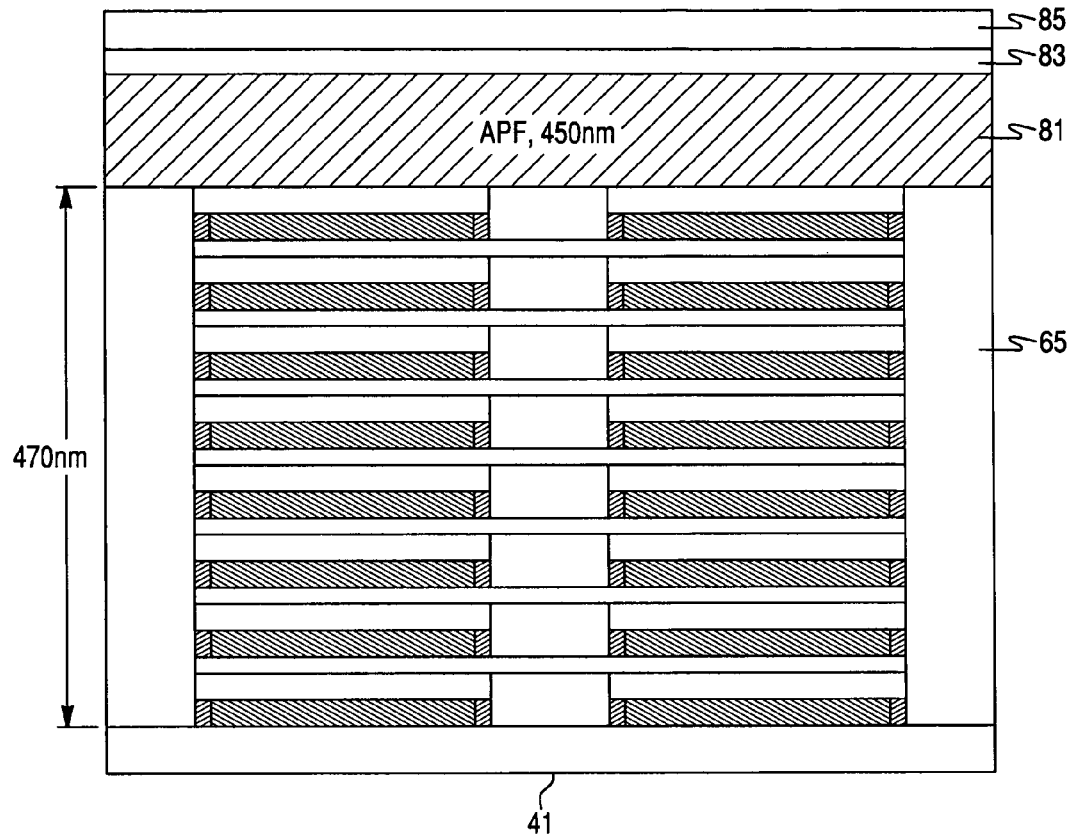
Figure 8B:
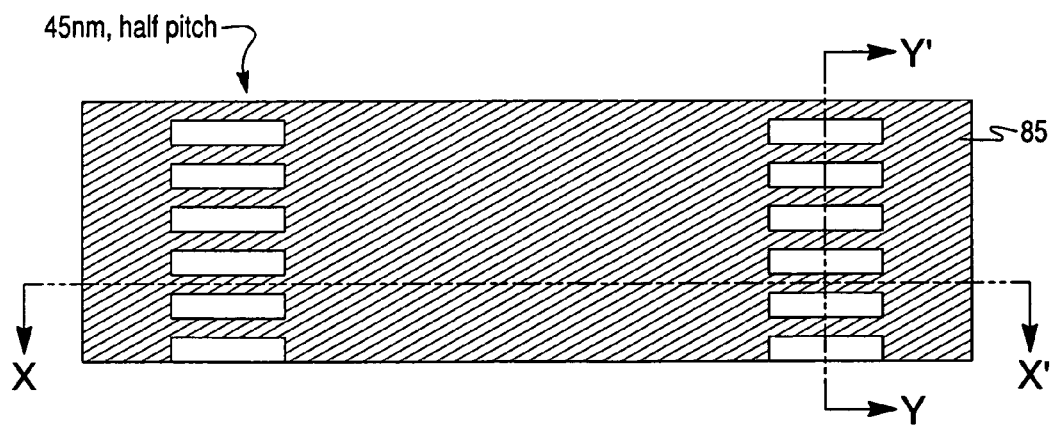
Figure 8C:
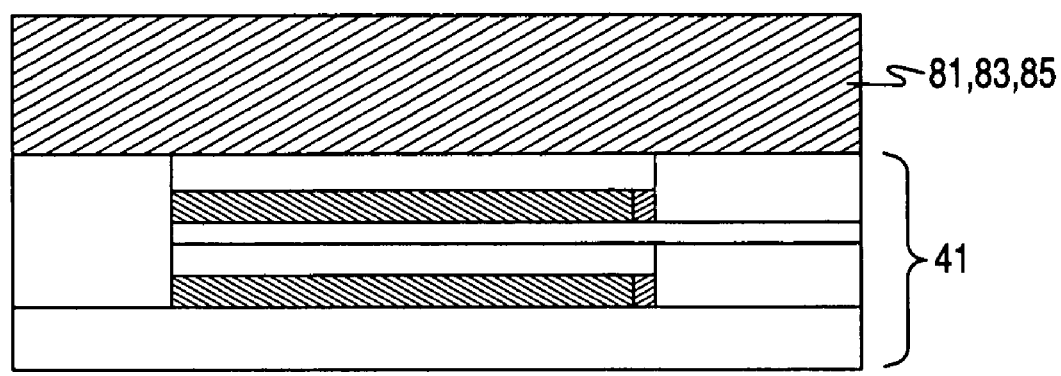
Figure 8D:
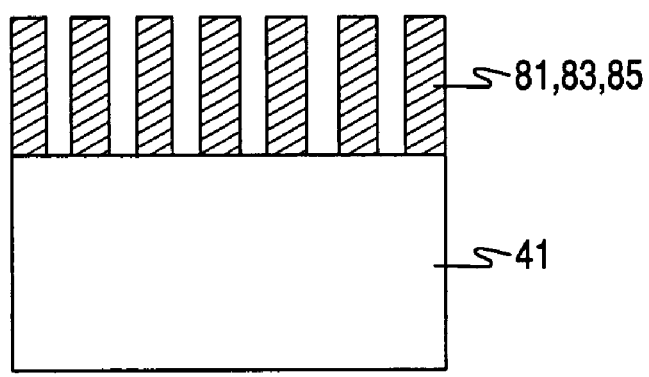

As shown in FIGS. 8A-8D, the vertical pillar conductors 65 are then patterned into word lines. Immersion lithography or other lithography techniques may be used to expose the photoresist. FIG. 8B shows the top view of the patterned photoresist with the underlying portions of the vertical pillar conductors exposed. FIG. 8C is the side cross sectional view of the device stack along the X direction (line X-X' in FIG. 8B), while FIG. 8D is the side cross sectional view of the device stack along the Y direction (line Y-Y' in FIG. 8B). As shown in FIG. 8A, the APF 81, DARC 83 and 193 nm photoresist 85 layers are formed over the device stack 41 and are then exposed and patterned as shown in FIGS. 8B and 8D. The spacing between the photoresist patterns may be about 45 to about 100 nm half pitch and the aspect ratio may be about 9:1. The exposed portions of the vertical pillar conductors are then etched to form column shaped word lines separated from each other in the Y direction. Each column shaped word line contacts a particular vertical column of diodes. It should be noted that word lines and bit lines may be reversed such that the horizontal conductors act as word lines and the vertical conductors act as bit lines.

Figure 9A:
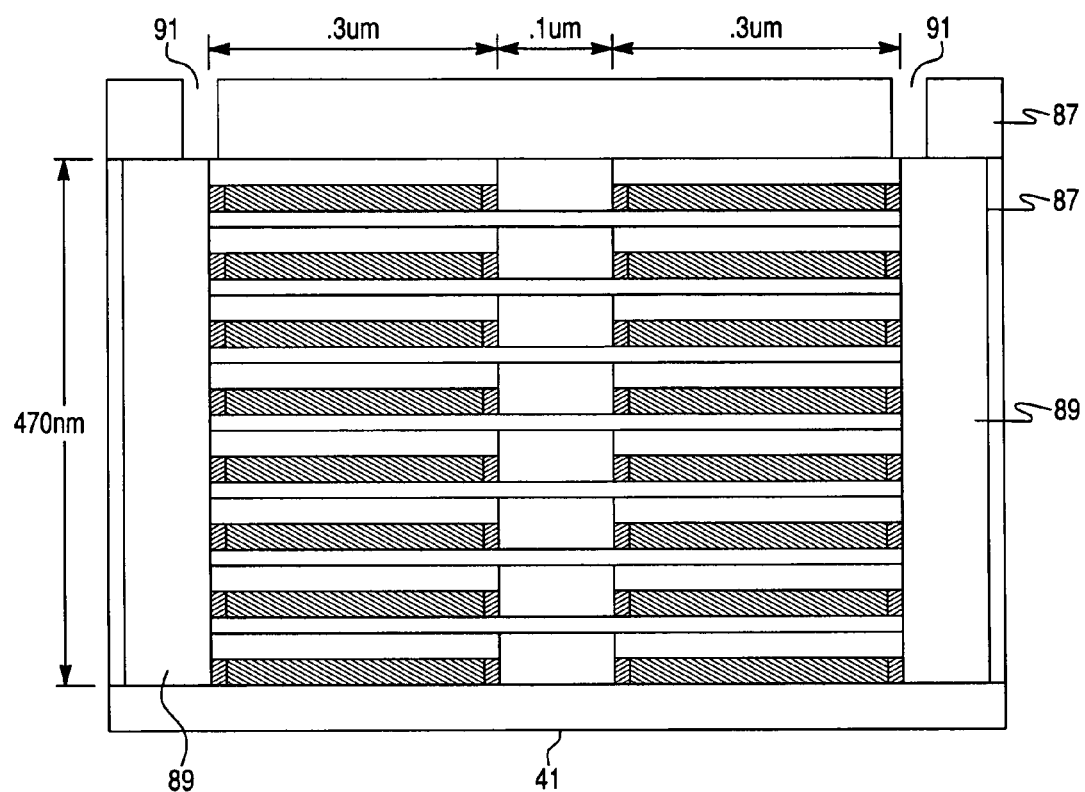
Figure 9B:
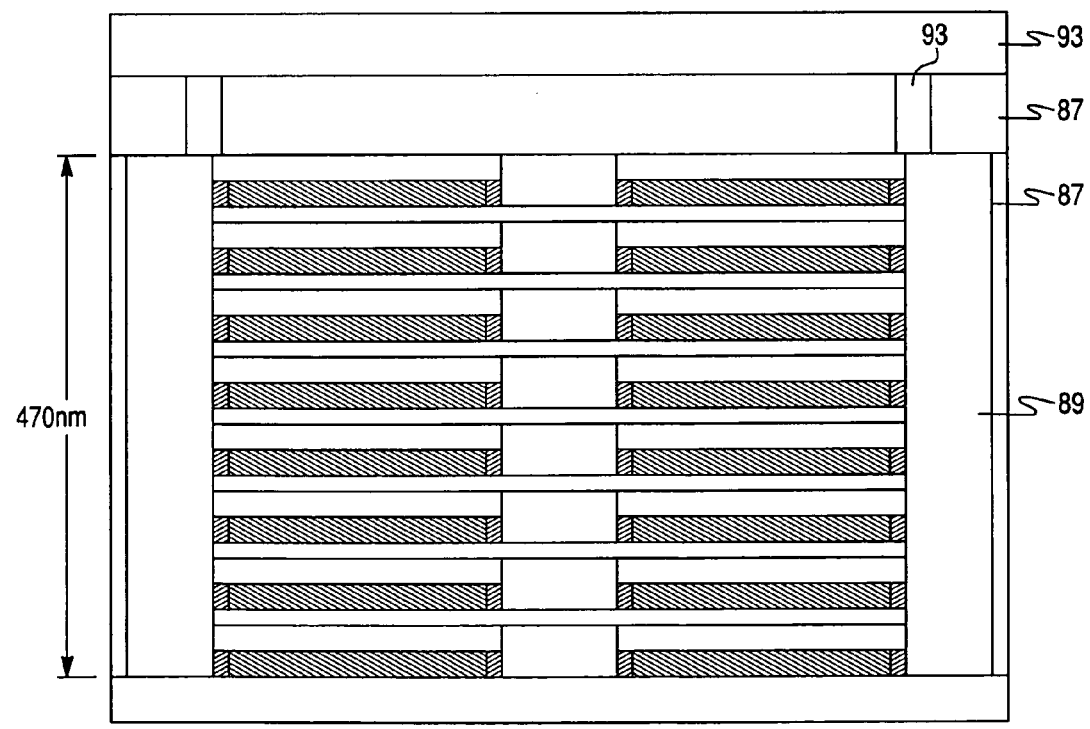
Figure 9C:
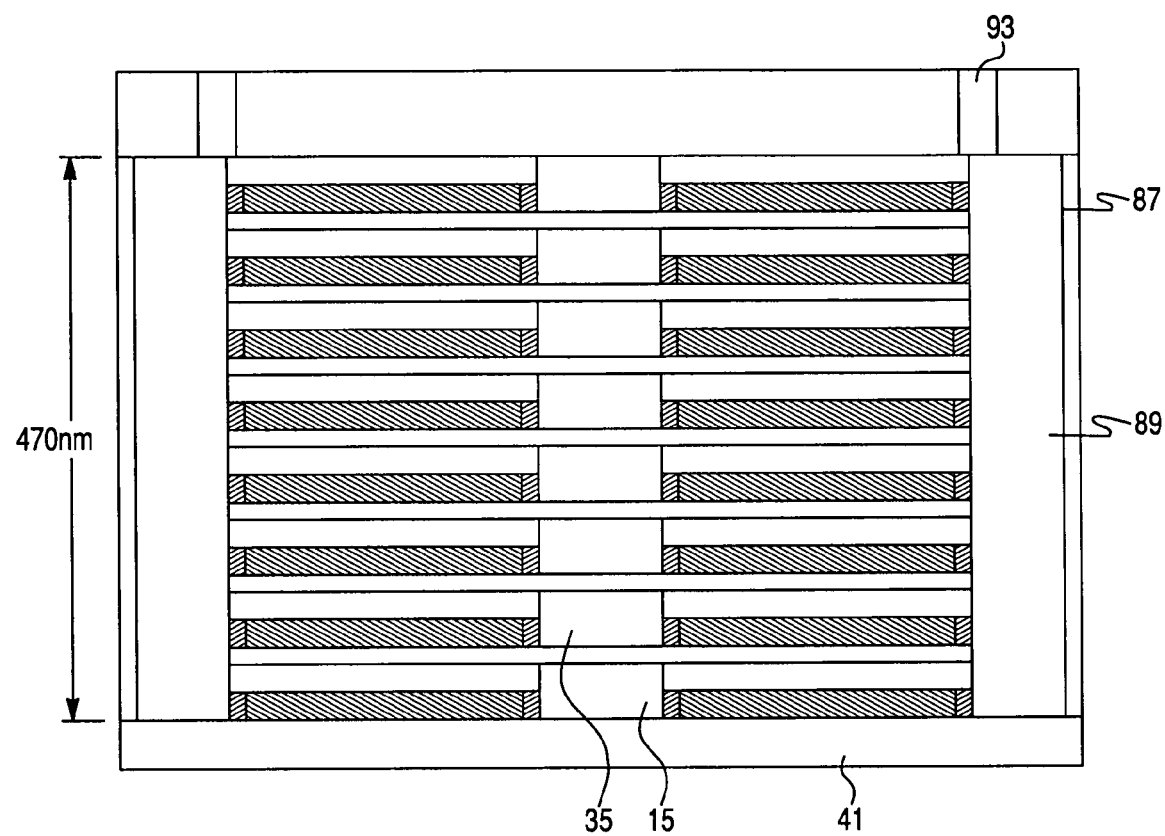

As shown in FIG. 9A, an insulating layer 87, such as silicon oxide or other insulating material is formed over the device stack. Then, as shown in FIG. 9A, this insulating layer is pattered by photolithography, such as 100 nm deep UV (DUV) photolithography, and etching to form openings 91 to the word lines 89. As shown in FIG. 9B, word line contacts 93, such as TiN and W contacts are formed in the openings to contact the word lines. As shown in FIG. 9C, the word line contacts are planarized by any suitable method, such as CMP, with the insulating layer 87 acting as a polish stop. The word line contacts remain in the openings after the planarization step. This completes the device.

If desired, the stack may be annealed at any suitable point in the process to react the semiconductor layers, such as silicon layers, with the adjacent conductors, such as the word and bit lines to form a silicide layer at the interface. For example, when the semiconductor layers comprise polysilicon or amorphous silicon and the word and bit lines contain a Ti layer adjacent to the semiconductor layers, a titanium silicide layer is formed at the interface of the semiconductor layers and the adjacent lines. Thus, first silicide regions are located between the first conductivity type regions 11 in the first 3 and the second 23 semiconductor layers and the respective first and second horizontal conductors 15, 35 (i.e., bit lines), and second silicide regions are located between the second conductivity type regions 51 in the first and the second semiconductor layers and the patterned vertical pillar conductors (i.e., word lines) 89.

Figure 10A:
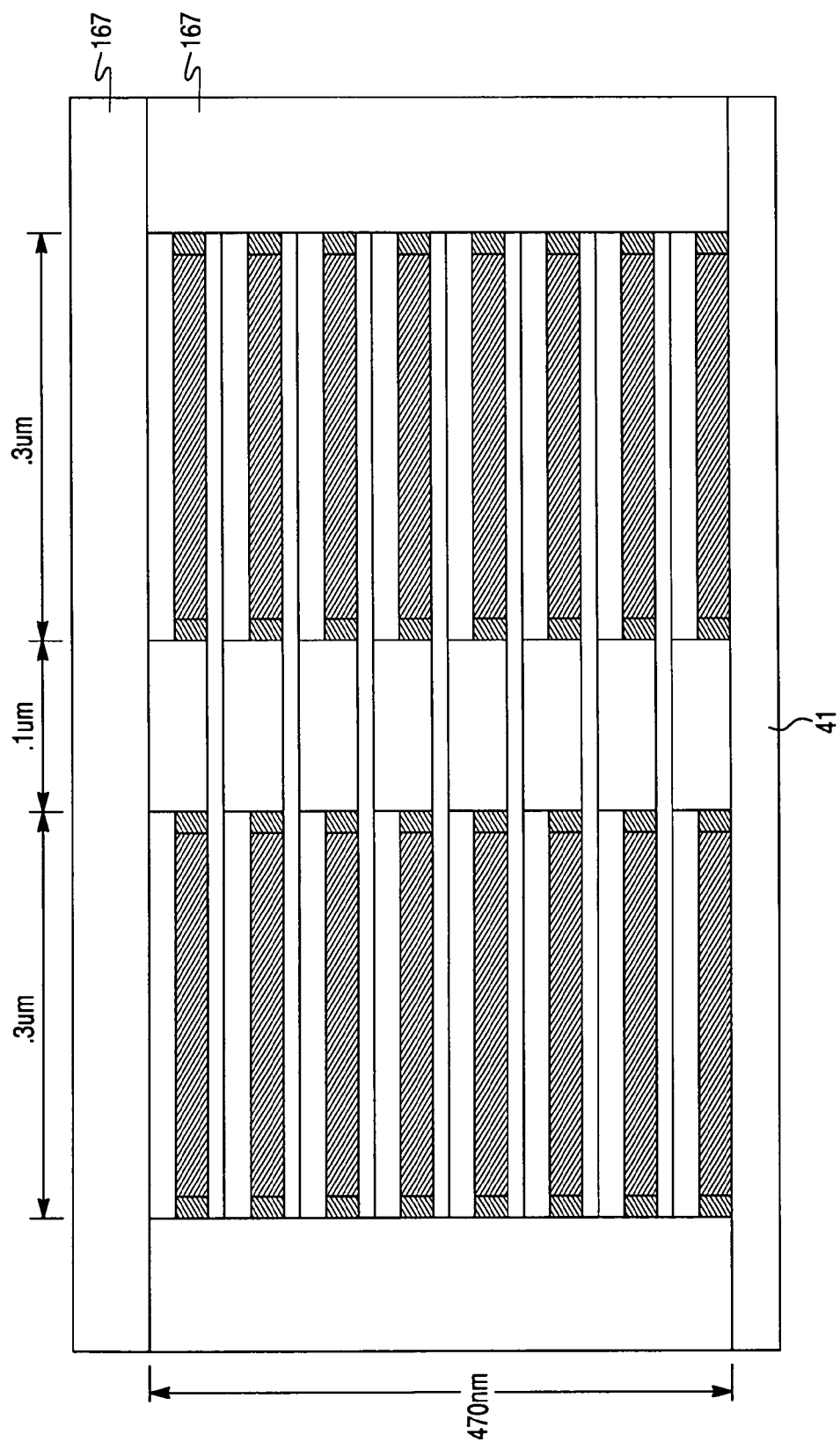

FIGS. 10A to 10J illustrate an alternative method of making the device. This alternative method first proceeds as illustrated in FIGS. 1-4. However, after the step shown in FIG. 4, a gap fill insulating layer 167 is formed over the device stack 41, as shown in FIG. 10A, instead of forming the at least one vertical pillar conductor by depositing conductive layers 61, as shown in FIG. 5A, and then patterning layers 61 into the pillar conductors 65, as shown in FIG. 5B. The insulating layer 167 may be an HDP silicon oxide layer or any other suitable insulating layer, as described above. Then, as shown in FIG. 10B, the insulating layer 167 is planarized by CMP or etchback to expose the top of the device stack 41 while the insulating layer 167 remains on the sides of the device stack 41.

After forming and planarizing the insulating layer 167, the alternative method proceeds as shown in FIGS. 6A to 7B and as described above to pattern and isolate the diodes in the Y direction. Then, as shown in FIGS. 10C, 10D, 10E and 10F, word line contact holes are formed in the insulating layer 167 instead of patterning the vertical conductors 65 into word lines as shown in FIGS. 8A to 8D.

FIG. 10C shows the side view of one or more photosensitive layers, such as the APF 181, DARC 183 and 193 nm photoresist 185 layers, formed over the device stack 41. FIG.

10D shows the top view of the patterned photoresist with the underlying portions of the insulating layer 167 exposed. FIG. 10E is the side cross sectional view of the device stack along the X direction (line X-X' in FIG. 10D), while FIG. 10F is the side cross sectional view of the device stack along the Y direction (line Y-Y' in FIG. 10D). As shown in FIGS. 10D to 10F the APF 181, DARC 183 and photoresist 185 layers are exposed and patterned. Immersion lithography or other lithography techniques may be used to expose the photoresist. The openings 186 in the photoresist patterns may be about 45 to about 100 nm, such as about 50 nm half pitch and the aspect ratio may be about 9:1. Alternatively, as shown in the top view in FIG. 10G, the openings 186 may be slightly wider in the X direction than higher in the Y direction to relax alignment requirements, such that the openings 186 may be about 70 nm wide in the X direction and about 50 nm high in the Y direction.

Figure 10H:
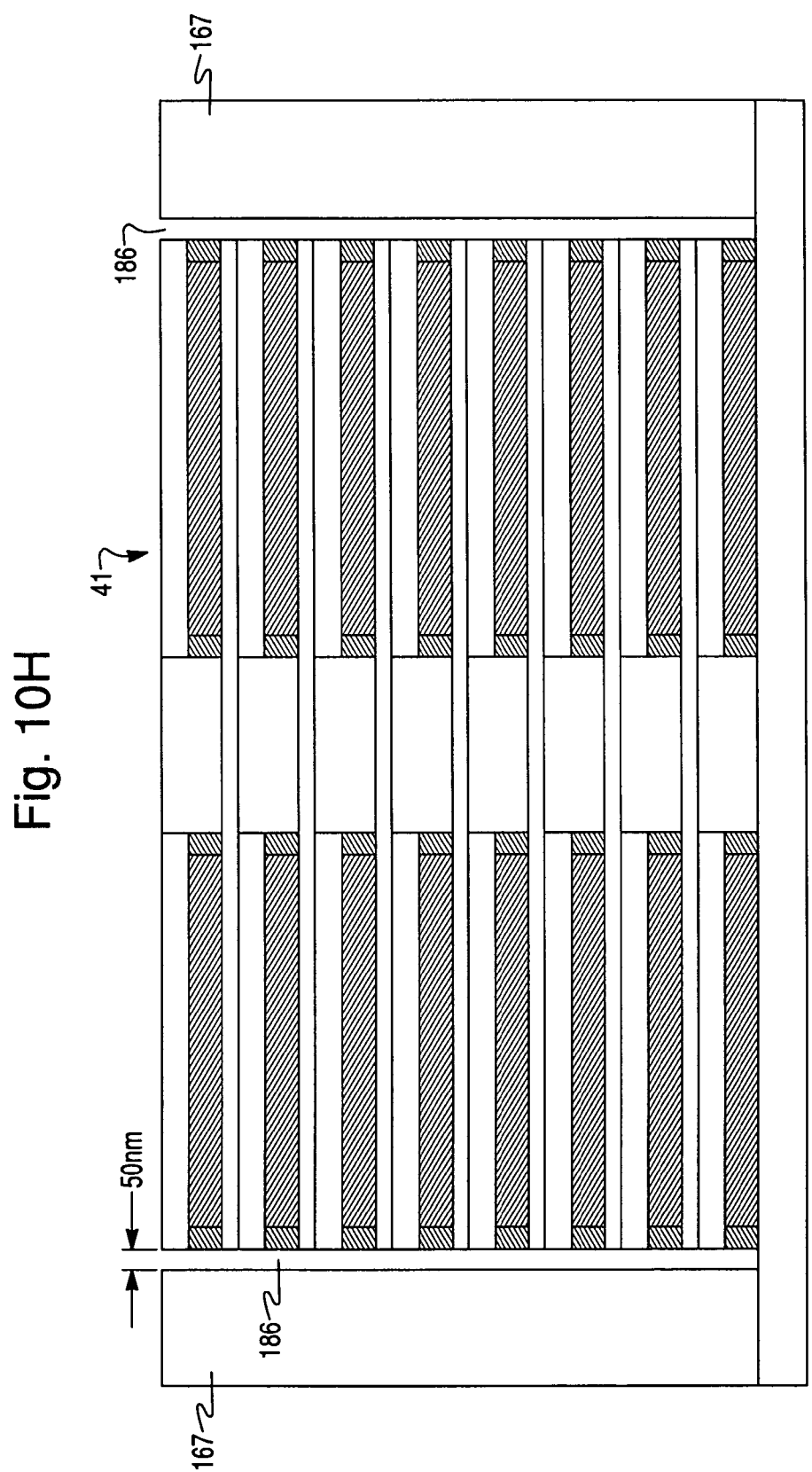

As shown in FIG. 10H, the exposed portions of the insulating layer 167 are then etched to form column shaped word line openings 188 separated from each other in the Y direction. The openings are about 45 to about 100 nm wide, such as about 50 nm wide. Each column shaped word line opening 188 exposes a particular vertical column of diodes. If desired, an optional antifuse dielectric layer 95 shown in FIG. 11 may be formed on each exposed sidewall of the diode at this time by thermally oxidizing the exposed sidewalls of each diode.

Figure 10I:
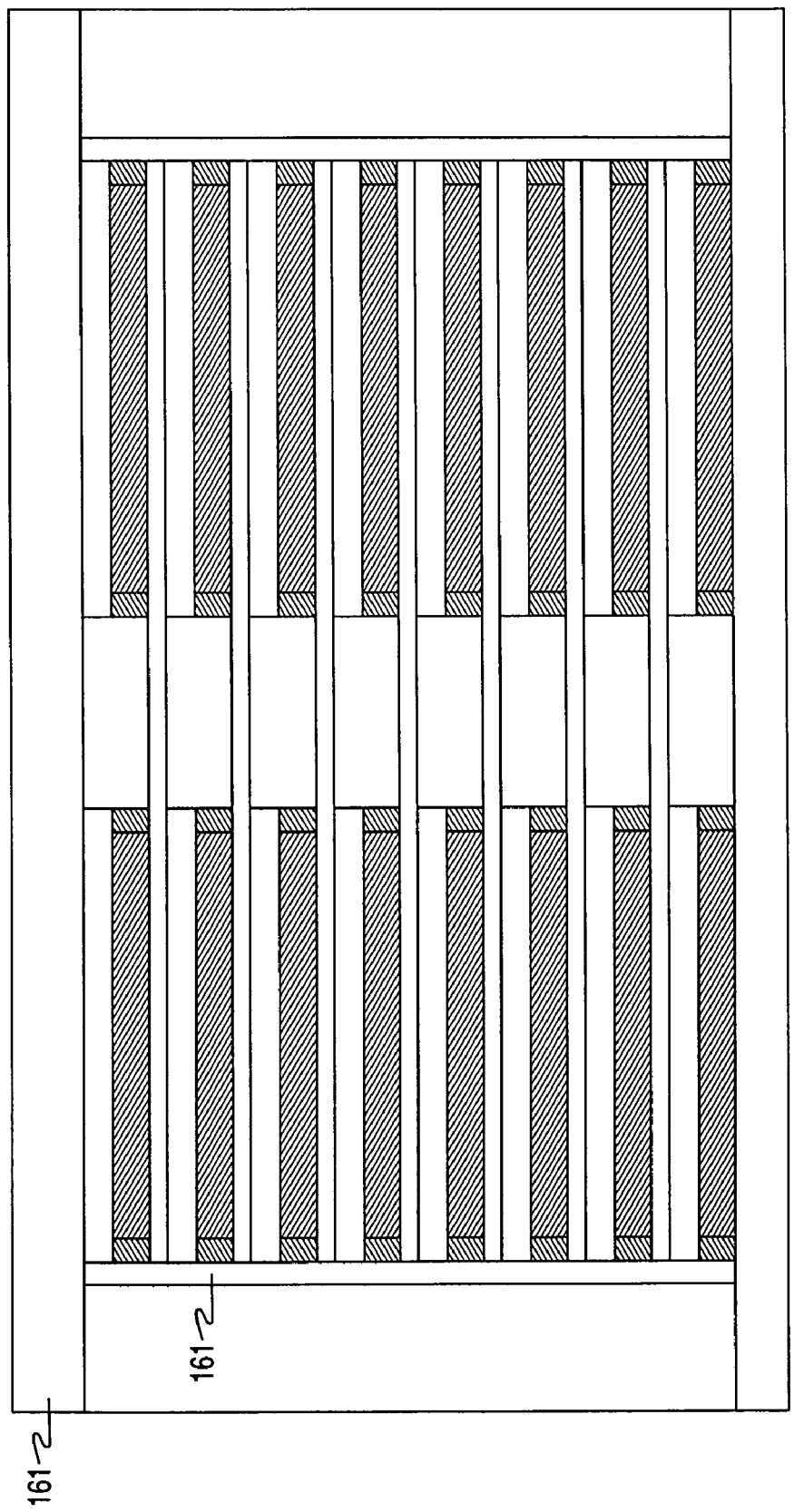
Figure 10J:
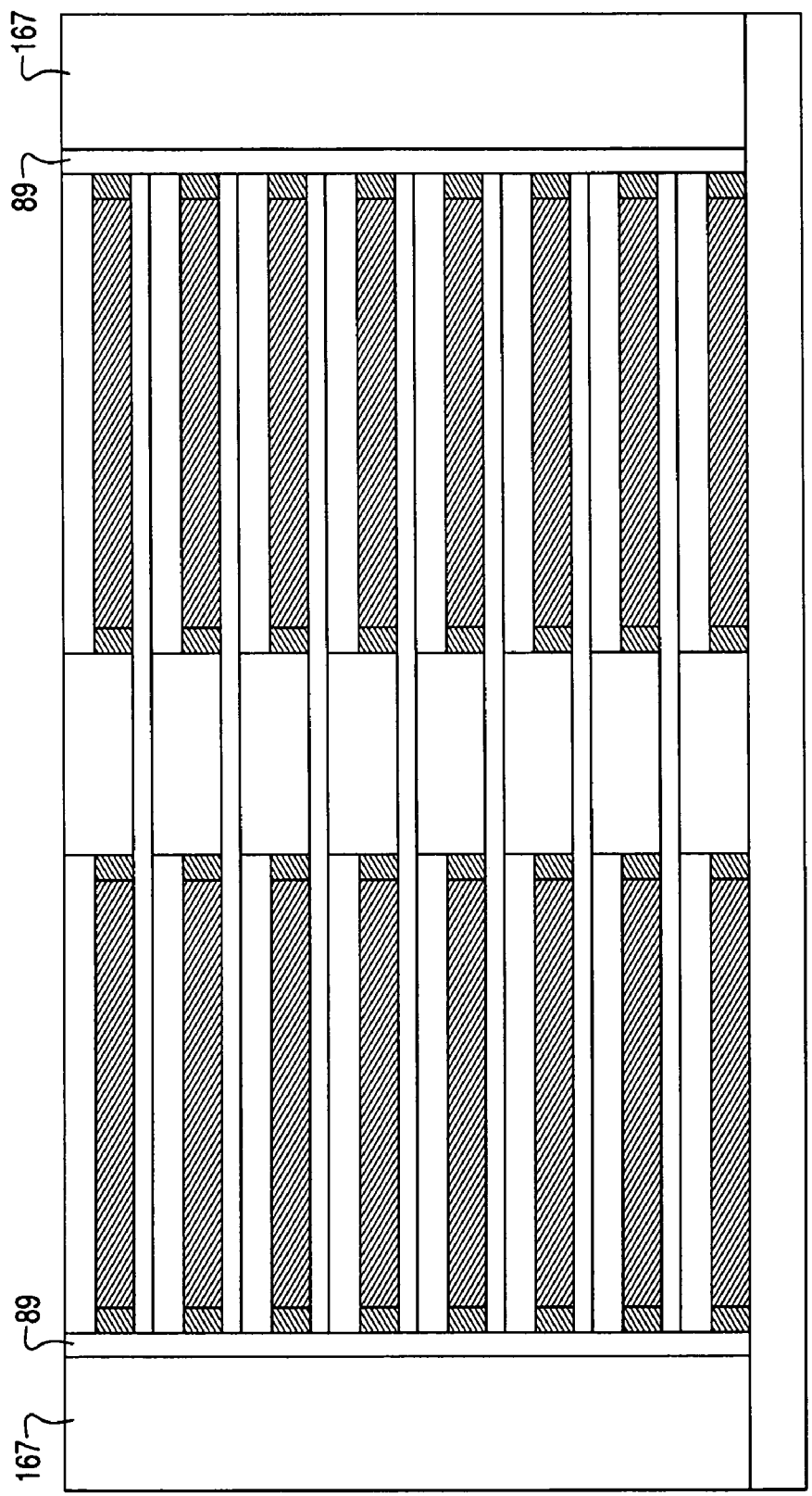

Then, as shown in FIG. 10I, the conductive layers 161 are formed over the device stack 41 and in the openings 188. The conductive layers 161 may comprise titanium, titanium nitride and tungsten, similar to the layers 61 shown in FIG. 5A. The conductive layer 161 form the vertical pillar conductor portions in the openings 188 in contact with the p-type regions of the diodes. The conductive layers 161 are then planarized by CMP or etchback to expose the top of the device stack 41 and to leave the vertical word lines 89 in the openings 188, as shown in FIG. 10J. The alternative process then proceeds as shown in FIGS. 9A-9C to form word line contacts 93. It should be noted that word lines and bit lines may be reversed such that the horizontal conductors act as word lines and the vertical conductors act as bit lines. Thus, in the method of the first embodiment, the word lines are formed by patterning conductive pillars and then depositing an insulating layer around the word lines, while in the alternative method, the word lines are formed by forming one or more conductive layers in openings in an insulating layer.

Figure 11:
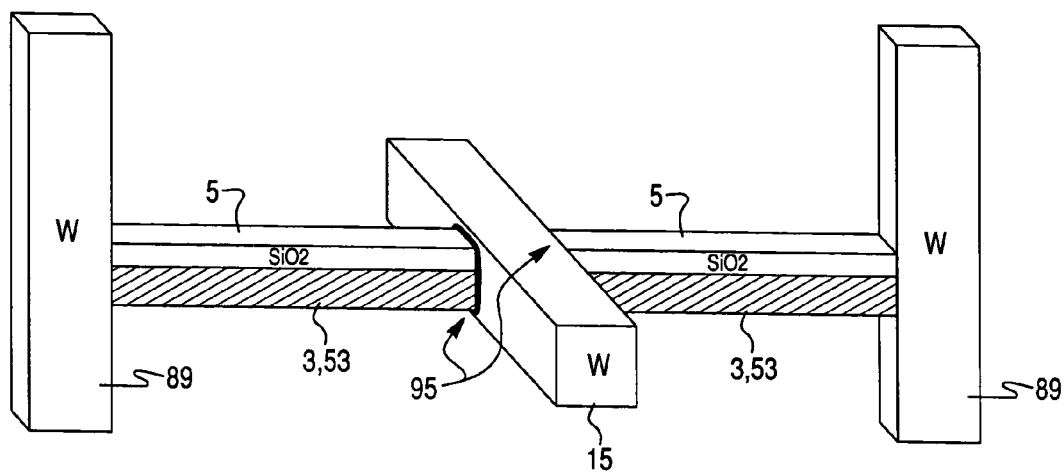
FIG. 11 is a three dimensional view of one device level of a three dimensional memory array according to an embodiment of the invention.

One device level of a completed non-volatile memory device is shown in three dimensions in FIG. 11. The above described method reduces the diode feature size and pitch for sub-45 nm lithography. By laying the diode structure on its side (i.e., horizontally) and stacking the diodes vertically, fewer lithography steps, such as only two immersion lithography steps, are used to form the structure. The aspect ratio will be about the same as for a single layer of upright diodes, but the structure etched will be a line instead of a post.

As can be seen from FIGS. 9C and 11, the non-volatile memory array includes an array of semiconductor diodes 53 (comprised of n-type regions 11, intrinsic regions 52 and p-type regions 51) in which each semiconductor diode is disposed parallel (i.e., horizontally) with respect to the substrate surface 1. Thus, in each semiconductor diode, a p-type semiconductor region and an n-type semiconductor region are substantially equidistant from the substrate surface. The term "substantially equidistant" includes within its scope a diode located over a non-planar substrate surface, such that some parts of the diode may be slightly farther from the substrate surface than other parts of the diode due to protrusions or recesses in the substrate surface, such as field oxide protrusions or metal or dielectric filled trenches.

As shown in FIG. 9C, the non-volatile memory array is a monolithic, three dimensional array of semiconductor diodes in which the semiconductor diodes are located in a plurality of device levels which are stacked in a vertical direction with respect to the substrate surface. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A portion of one device level of FIG. 9C in an X-Z plane is shown in FIG. 11. In each device level, there may be a plurality of diodes 53 in the X direction (i.e., right to left in FIGS. 9C and 11) and a plurality of diodes 53 in the Y direction (i.e., in and out of the page in FIGS. 9C and 11). Each diode in the Y direction is connected to a different word line 89. However, the same bit line 15 contacts all of the diodes 53 in one device level in the Y direction. In contrast, the same word line 89 contacts all of the diodes 53 in a column in a plurality of device levels. However, a different bit line contacts the diodes in each device level. Thus, while the word lines extend vertically and the bit lines extend horizontally, the resulting circuit schematic is similar to a conventional cross bar array with word lines extending in one direction and the bit lines extending in a perpendicular direction, except that the bit and word lines do not extend in the same plane parallel to the substrate surface. The resulting diodes may be about 30 to 50 nm, such as about 40 nm high, about 40 to about 75, such as about 45 nm wide, and about 0.1 to about 1 microns, such as about 0.3 microns long. Other dimensions may also be used, depending on the specific lithography technique.

In the completed device, at least one pillar conductor, such as a word line 89, is disposed vertically with respect to the substrate surface 1. This word line is electrically connected to one conductivity type regions 51 of the diodes of the array of semiconductor diodes. A plurality of horizontal conductors 15, 35, such as bit lines, are disposed horizontally in the plurality of device levels with respect to the substrate surface 1. The bit lines are electrically connected to the other conductivity type regions 11 of the diodes 53 of the array of semiconductor diodes. As noted above with respect to FIG. 3B, the horizontal conductors extend to a different distance along the substrate surface in a stepped configuration such that a portion of each horizontal conductor is exposed below an adjacent overlying horizontal conductor. Separate electrical connectors contact each exposed portion of each horizontal conductor.

If desired, each non-volatile memory device of the non-volatile memory array includes an optional antifuse dielectric 95 disposed in series with a semiconductor diode, as shown in FIG. 11. In operation, the antifuse is breached to write a data bit. Alternatively, each non-volatile memory device is made up solely of one semiconductor diode from the array of semiconductor diodes. In operation, the semiconductor diode is adapted to change resistivity state in response to an external voltage pulse to write or erase a data bit.

For example, the semiconductor diodes described in U.S. Published Application Numbers US 2007/0164309 A1 and US 2007/0072360 A1 which are hereby incorporated by reference in their entirety, can achieve three, four, or more stable resistivity states. In some embodiments of the present invention, semiconductor material can be converted from an initial low-resistivity state to a higher-resistivity state; then, upon application of an appropriate electrical pulse, can be returned to a lower-resistivity state. In other embodiments of the present invention, semiconductor material can be converted from an initial high-resistivity state to a lower-resistivity state; then, upon application of an appropriate electrical pulse, can be returned to a higher-resistivity state. The voltage pulses may be forward and/or reverse bias pulses to switch the diode from the higher to lower and/or from lower to higher resistivity states, respectively. These embodiments can be employed independently or combined to form a memory cell which can have two or more data states, and can be one-time-programmable or rewriteable.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A method of making a non-volatile memory device, comprising:
   providing a substrate having a substrate surface; and
   forming a non-volatile memory array over the substrate surface;
   wherein:
   the non-volatile memory array comprises an array of semiconductor diodes;
   each semiconductor diode of the array of semiconductor diodes is disposed substantially parallel to the substrate surface;
   each semiconductor diode is disposed horizontally with respect to the substrate surface;
   in each semiconductor diode, a p-type semiconductor region and an n-type semiconductor region are equidistant from the substrate surface;
   the step of forming the non-volatile memory array comprises monolithically forming a plurality of device levels of the semiconductor diodes such that the plurality of device levels are stacked in a vertical direction with respect to the substrate surface; and
   the step of forming the non-volatile memory array further comprises:
      forming a first semiconductor layer over the substrate surface;
      forming a first insulating layer over the first semiconductor layer;
      forming a first trench extending through the first semiconductor layer and the first insulating layer;
      doping first sidewalls of the first semiconductor layer exposed in the first trench with dopants of the first conductivity type to form first conductivity type regions in the first semiconductor layer;
      forming a first conductive layer in the first trench and over the first insulating layer;
      planarizing the first conductive layer such that the first conductive layer forms a first horizontal conductor in the first trench and the first horizontal conductor electrically contacts the first conductivity type regions in the first semiconductor layer;
      forming an interlevel insulating layer over the first horizontal conductor;
      forming a second semiconductor layer over the interlevel insulating layer;
      forming a second insulating layer over the second semiconductor layer;
      forming a second trench extending through the second semiconductor layer and the second insulating layer up to the interlevel insulating layer;
      doping first sidewalls of the second semiconductor layer exposed in the second trench with dopants of the first conductivity type to form first conductivity type regions in the second semiconductor layer;
      forming a second conductive layer in the second trench and over the second insulating layer;
      planarizing the second conductive layer such that the second conductive layer forms a second horizontal conductor in the second trench and the second horizontal conductor electrically contacts the first conductivity type regions in the second semiconductor layer;
      patterning the first semiconductor layer, the first insulating layer, the second semiconductor layer and the second insulating layer to expose second sidewalls of the first and the second semiconductor layers;
      doping at least one exposed second sidewall of each of the first and the second semiconductor layers with dopants of a second conductivity type to form second conductivity type regions in the first and the second semiconductor layers; and
      forming at least one vertical pillar conductor which electrically contacts the second conductivity type regions in the first and the second semiconductor layers.

2. The method of claim 1, wherein:
   the step of forming the at least one vertical pillar conductor comprises forming at least two vertical pillar conductors such that a first vertical pillar conductor is separated from the first and the second horizontal conductors and from the second vertical pillar conductor along a first direction;
   a first semiconductor diode is located in a first device level between the first vertical pillar conductor and the first horizontal conductor;
   a second semiconductor diode is located in the first device level between the second vertical pillar conductor and the first horizontal conductor;
   a third semiconductor diode is located in a second device level between the first vertical pillar conductor and the second horizontal conductor; and
   a fourth semiconductor diode is located in the second device level between the second vertical pillar conductor and the second horizontal conductor.

3. The method of claim 2, further comprising:
   patterning the first and the second semiconductor layers and the first and the second insulating layers to form isolation trenches between adjacent semiconductor diodes separated from each other along a second direction perpendicular to the first direction; and
   filling the isolation trenches with an insulating material.

4. The method of claim 1, further comprising:
   forming first silicide regions located between the first conductivity type regions in the first and the second semiconductor layers and the respective first and second horizontal conductors; and
   forming second silicide regions located between the second conductivity type regions in the first and the second semiconductor layers and the at least one vertical pillar conductor.

5. The method of claim 1, further comprising:

patterning the second horizontal conductor such that a portion of the first horizontal conductor is exposed below the second horizontal conductor in a stepped configuration;

forming a first electrical connector in contact with the exposed portion of the first horizontal conductor; and forming a second electrical connector in contact with the second horizontal conductor.

6. The method of claim 1, wherein the steps of doping the first and the second sidewalls of the first and the second semiconductor layers comprises halo doping the first and the second sidewalls.

7. A method of making a semiconductor device, comprising:

forming a first semiconductor layer over a substrate surface;

forming a first insulating layer over the first semiconductor layer;

forming a first trench extending through the first semiconductor layer and the first insulating layer;

doping first sidewalls of the first semiconductor layer exposed in the first trench with dopants of the first conductivity type to form first conductivity type regions in the first semiconductor layer;

forming a first conductive layer in the first trench and over the first insulating layer planarizing the first conductive layer such that the first conductive layer forms a first horizontal conductor in the first trench and the first horizontal conductor electrically contacts the first conductivity type regions in the first semiconductor layer;

forming an interlevel insulating layer over the first horizontal conductor;

forming a second semiconductor layer over the interlevel insulating layer;

forming a second insulating layer over the second semiconductor layer;

forming a second trench extending through the second semiconductor layer and the second insulating layer up to the interlevel insulating layer;

doping first sidewalls of the second semiconductor layer exposed in the second trench with dopants of the first conductivity type to form first conductivity type regions in the second semiconductor layer;

forming a second conductive layer in the second trench and over the second insulating layer;

planarizing the second conductive layer such that the second conductive layer forms a second horizontal conductor in the second trench and the second horizontal conductor electrically contacts the first conductivity type regions in the second semiconductor layer;

patterning the first semiconductor layer, the first insulating layer, the second semiconductor layer and the second insulating layer to expose second sidewalls of the first and the second semiconductor layers;

doping at least one exposed second sidewall of each of the first and the second semiconductor layers with dopants of a second conductivity type to form second conductivity type regions in the first and the second semiconductor layers; and forming at least one vertical pillar conductor which electrically contacts the second conductivity type regions in the first and the second semiconductor layers.

8. The method of claim 7, wherein:

the step of forming the at least one vertical pillar conductor comprises forming at least two vertical pillar conductors such that a first vertical pillar conductor is separated from the first and the second horizontal conductors and from the second vertical pillar conductor along a first direction;

a first semiconductor diode is located in a first device level between the first vertical pillar conductor and the first horizontal conductor;

a second semiconductor diode is located in the first device level between the second vertical pillar conductor and the first horizontal conductor;

a third semiconductor diode is located in a second device level between the first vertical pillar conductor and the second horizontal conductor; and a fourth semiconductor diode is located in the second device level between the second vertical pillar conductor and the second horizontal conductor.

9. The method of claim 8, further comprising:

patterning the first and the second semiconductor layers and the first and the second insulating layers to form isolation trenches between adjacent semiconductor diodes separated from each other along a second direction perpendicular to the first direction; and filling the isolation trenches with an insulating material.

10. The method of claim 7, further comprising:

forming first silicide regions located between the first conductivity type regions in the first and the second semiconductor layers and the respective first and second horizontal conductors; and forming second silicide regions located between the second conductivity type regions in the first and the second semiconductor layers and the at least one vertical pillar conductor.

11. The method of claim 7, further comprising:

patterning the second horizontal conductor such that a portion of the first horizontal conductor is exposed below the second horizontal conductor in a stepped configuration;

forming a first electrical connector in contact with the exposed portion of the first horizontal conductor; and forming a second electrical connector in contact with the second horizontal conductor.

12. The method of claim 7, wherein the steps of doping the first and the second sidewalls of the first and the second semiconductor layers comprises halo doping the first and the second sidewalls.

* * * * *